(12) United States Patent
Ohtani et al.

(10) Patent No.: US 7,439,111 B2
(45) Date of Patent: Oct. 21, 2008

(54) SEMICONDUCTOR DEVICE AND MANUFACTURING METHOD THEREOF

(75) Inventors: Hisashi Ohtani, Tochigi (JP); Koji Moriya, Atsugi (JP); Masayuki Sakakura, Ebina (JP); Hideto Ohnuma, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 437 days.

(21) Appl. No.: 11/221,767

(22) Filed: Sep. 9, 2005

(65) Prior Publication Data

US 2006/0079039 A1    Apr. 13, 2006

(30) Foreign Application Priority Data

Sep. 29, 2004   (JP) ............................. 2004-284952

(51) Int. Cl.
H01L 21/336   (2006.01)
H01L 21/84    (2006.01)

(52) U.S. Cl. ...................................... 438/151; 438/781

(58) Field of Classification Search ................ 438/780, 438/781, 151
See application file for complete search history.

(56) References Cited

U.S. PATENT DOCUMENTS

| | | | | | |
|---|---|---|---|---|---|
| 3,834,939 | A | * | 9/1974 | Beyer et al. | 438/781 |
| 4,041,190 | A | * | 8/1977 | Dubois et al. | 430/296 |
| 5,045,504 | A | * | 9/1991 | Gualandris et al. | 438/763 |
| 5,106,787 | A | * | 4/1992 | Yen | 438/800 |
| 5,230,929 | A | * | 7/1993 | Caporiccio et al. | 427/536 |
| 5,270,259 | A | * | 12/1993 | Ito et al. | 438/623 |
| 5,320,983 | A | * | 6/1994 | Ouellet | 438/782 |
| 5,334,454 | A | * | 8/1994 | Caporiccio et al. | 428/412 |
| 5,358,739 | A | * | 10/1994 | Baney et al. | 427/226 |
| 5,370,903 | A | * | 12/1994 | Mine et al. | 427/126.2 |
| 5,370,904 | A | * | 12/1994 | Mine et al. | 427/126.2 |
| 5,372,842 | A | * | 12/1994 | Mine et al. | 427/126.2 |
| 5,380,555 | A | * | 1/1995 | Mine et al. | 427/226 |
| 5,512,650 | A | * | 4/1996 | Leir et al. | 528/14 |
| 5,614,251 | A | * | 3/1997 | Sakamoto et al. | 438/780 |
| 5,843,526 | A | * | 12/1998 | Lukacs, III et al. | 427/228 |
| 5,866,197 | A | * | 2/1999 | Bremmer et al. | 438/763 |
| 6,087,024 | A | * | 7/2000 | Whinnery et al. | 428/613 |
| 6,288,438 | B1 | | 9/2001 | Mizuhara et al. | |
| 6,589,889 | B2 | * | 7/2003 | Endisch et al. | 438/780 |
| 6,613,834 | B2 | * | 9/2003 | Nakata et al. | 524/588 |

(Continued)

FOREIGN PATENT DOCUMENTS

EP         543665      *   5/1993

(Continued)

*Primary Examiner*—M. Wilczewski
(74) *Attorney, Agent, or Firm*—Eric J. Robinson; Robinson Intellectual Property Law Office, P.C.

(57) ABSTRACT

An object of the invention is to form an insulating film having favorable insulation and planarity. An insulating film is formed by performing heat treatment a resin containing a siloxane polymer after application, in an atmosphere including an inert gas as its main component and having an oxygen concentration of 5% or less and a water concentration of 1% or less. Preferably, an oxygen concentration is 1% or less and a water concentration is 0.1% or less. The resin containing a siloxane polymer includes a methyl group and a phenyl group. Further, the inert gas is nitrogen.

38 Claims, 12 Drawing Sheets

U.S. PATENT DOCUMENTS

| | | |
|---|---|---|
| 6,699,799 B2 * | 3/2004 | Ahn et al. ............. 438/781 |
| 6,833,560 B2 | 12/2004 | Konuma et al. |
| 6,891,237 B1 * | 5/2005 | Bao et al. ............. 257/410 |
| 6,958,525 B2 * | 10/2005 | Nakata et al. ............. 257/642 |
| 7,235,866 B2 * | 6/2007 | Nakata et al. ............. 257/642 |
| 2001/0033026 A1 * | 10/2001 | Nakata et al. ............. 257/759 |
| 2001/0053559 A1 | 12/2001 | Nagao et al. |
| 2003/0087534 A1 * | 5/2003 | Mallikarjunan et al. ..... 438/781 |
| 2003/0207131 A1 * | 11/2003 | Nakata et al. ............. 428/447 |
| 2004/0028915 A1 * | 2/2004 | Shibuya et al. ............. 428/447 |
| 2004/0082195 A1 * | 4/2004 | Yudasaka et al. ........... 438/782 |
| 2004/0180223 A1 * | 9/2004 | Shibuya et al. ............. 428/447 |
| 2004/0180556 A1 * | 9/2004 | Chiang et al. ............. 438/781 |
| 2005/0095840 A1 * | 5/2005 | Bhanap et al. ............. 438/623 |
| 2005/0130439 A1 * | 6/2005 | Goo et al. ............. 438/763 |
| 2005/0139786 A1 | 6/2005 | Tanaka et al. |
| 2005/0191846 A1 * | 9/2005 | Cheung et al. ............. 438/623 |
| 2006/0022357 A1 * | 2/2006 | Nakata et al. ............. 257/791 |
| 2006/0040509 A1 * | 2/2006 | Yim et al. ............. 438/781 |
| 2006/0134891 A1 * | 6/2006 | Ohnuma et al. ............. 438/482 |
| 2006/0189163 A1 * | 8/2006 | Motoyama et al. .......... 438/781 |
| 2007/0054501 A1 * | 3/2007 | Carman et al. ............. 438/781 |
| 2007/0077781 A1 * | 4/2007 | Lee et al. ............. 438/781 |
| 2007/0077782 A1 * | 4/2007 | Lee et al. ............. 438/781 |

FOREIGN PATENT DOCUMENTS

| | | |
|---|---|---|
| JP | 10-242277 | 9/1998 |

\* cited by examiner

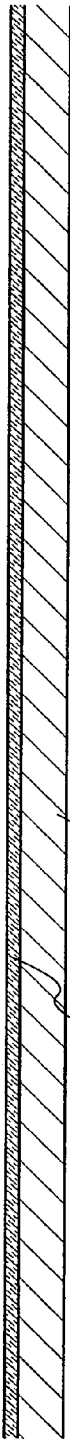
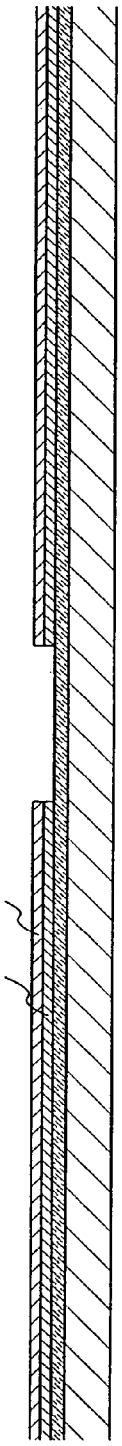
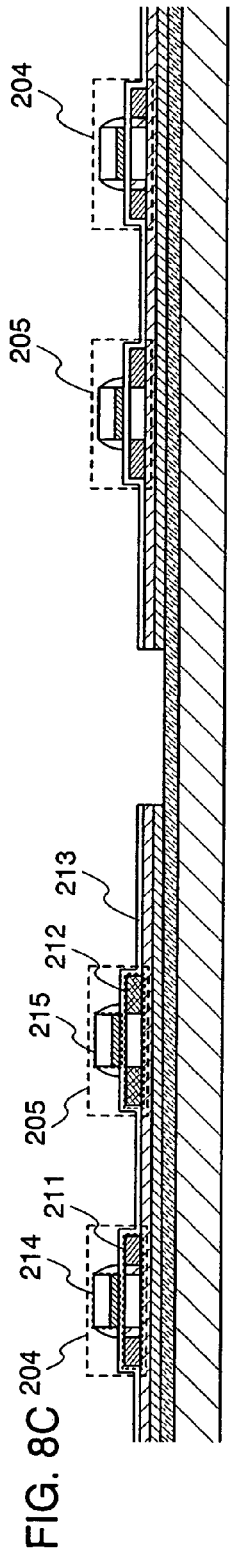
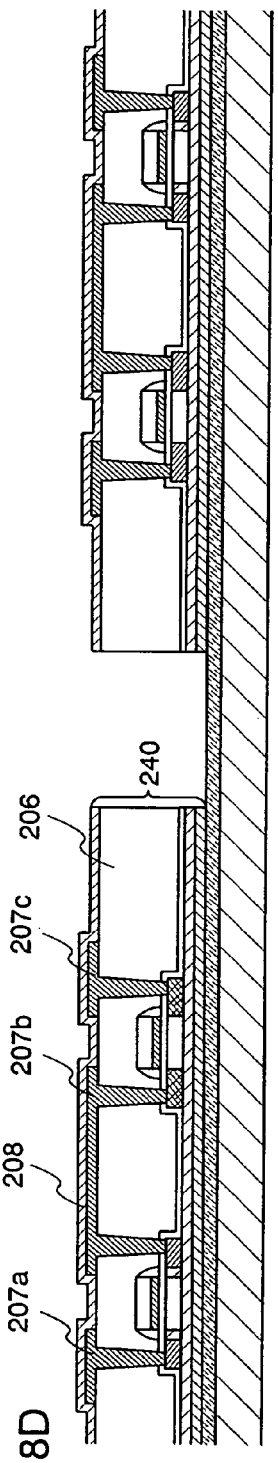
FIG. 8A
FIG. 8B
FIG. 8C
FIG. 8D

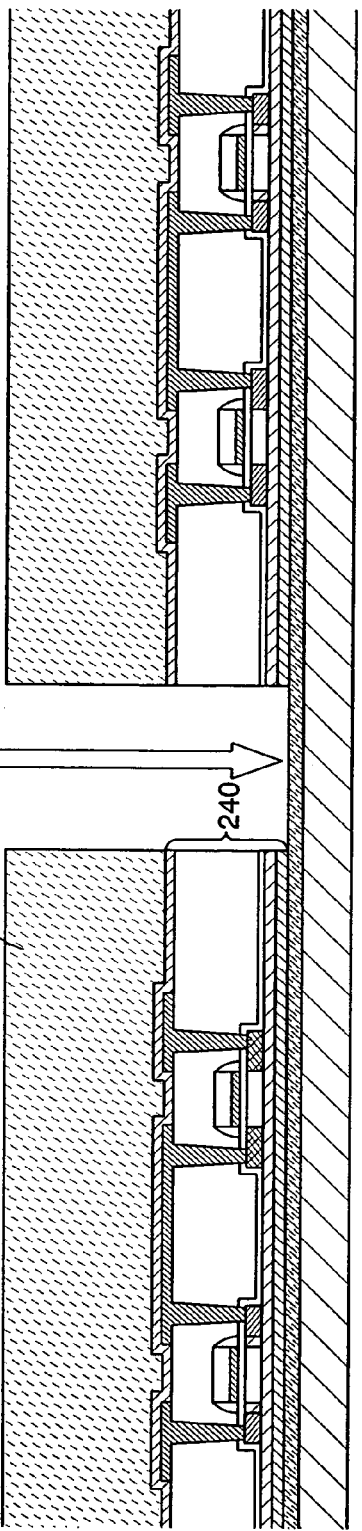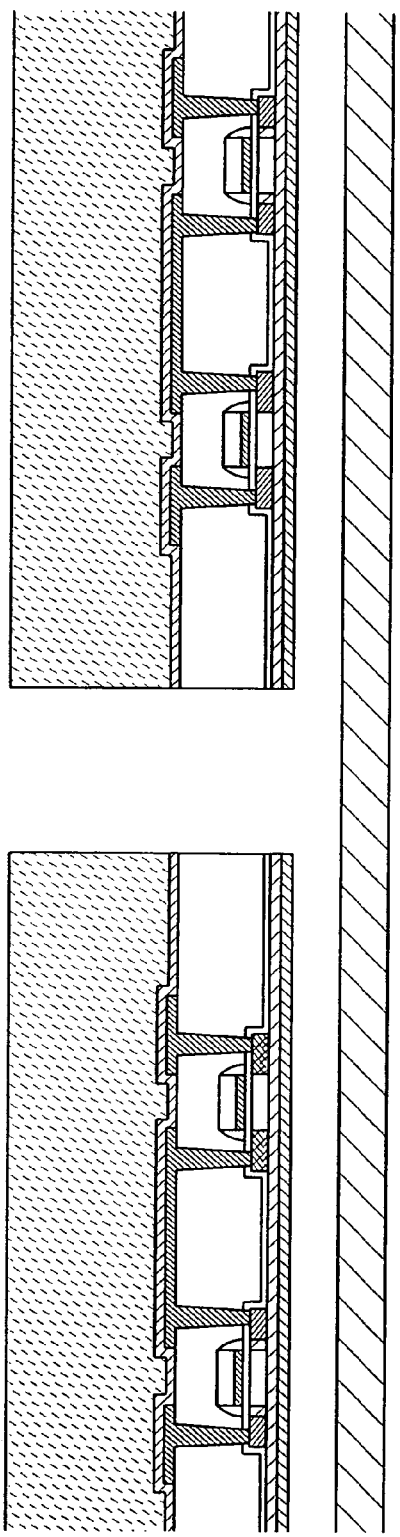
FIG. 9A
FIG. 9B

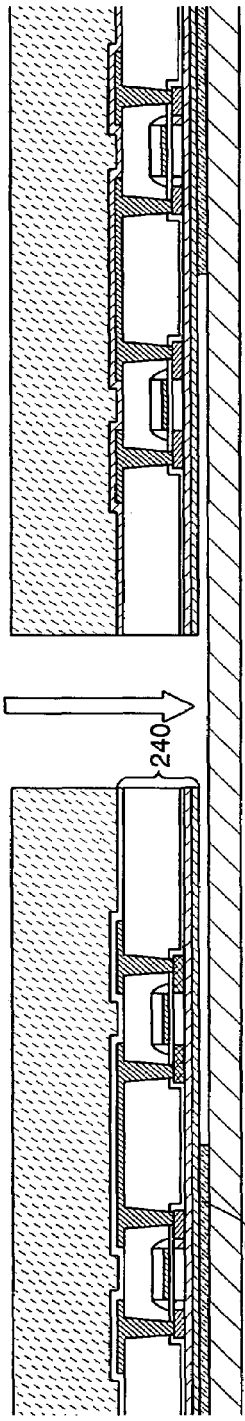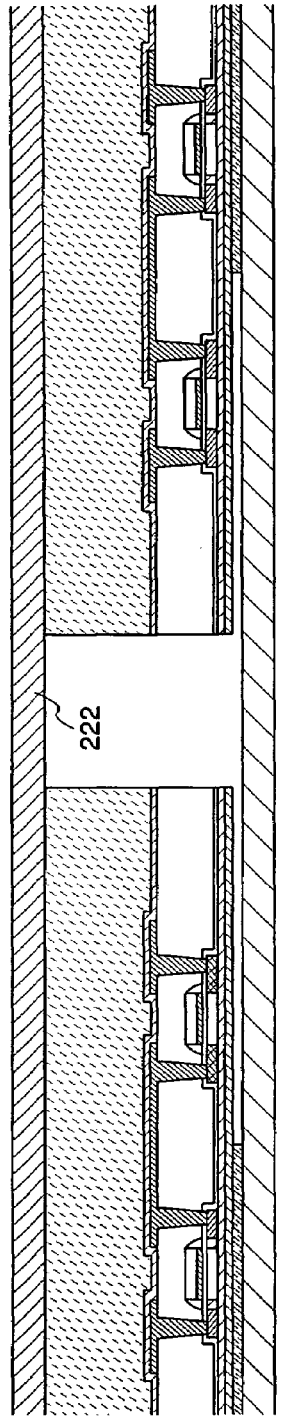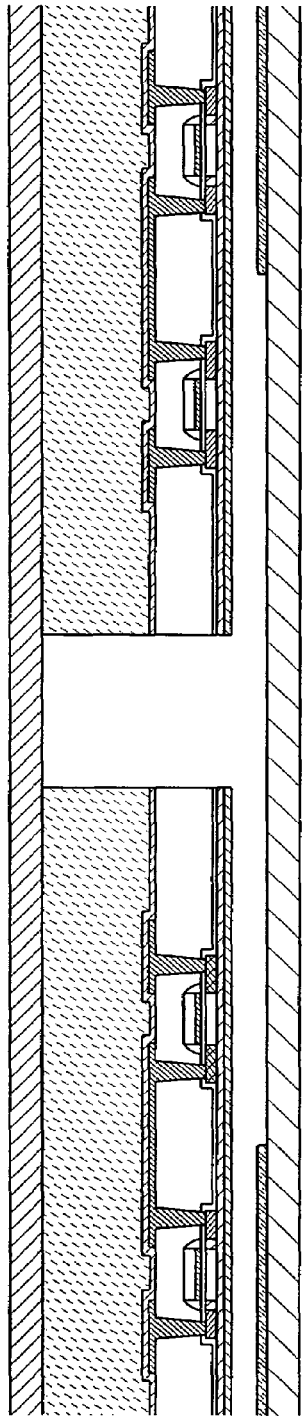

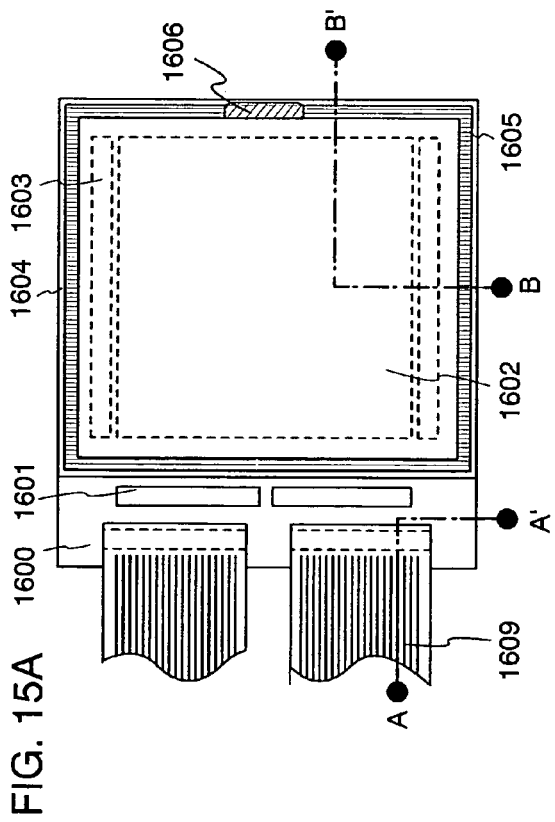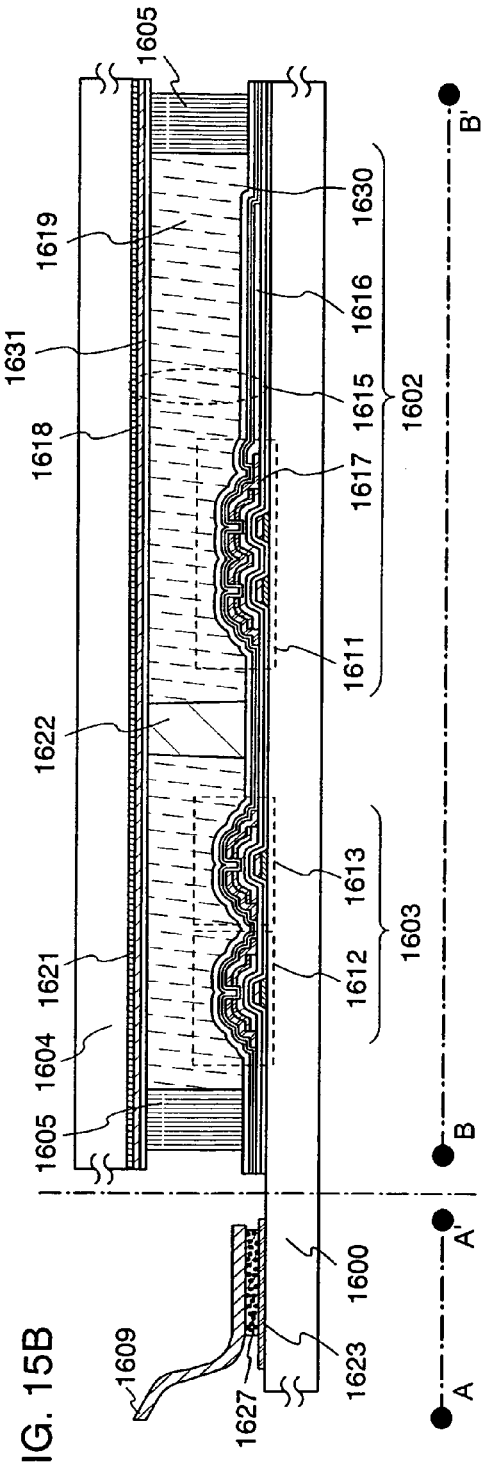
FIG. 15A
FIG. 15B

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. In particular, the invention relates to a method for forming an interlayer insulating film over a semiconductor element (device) such as a thin film transistor (hereinafter abbreviated as "TFT" in this specification).

2. Description of the Related Art

In a semiconductor process, an insulating film is utilized in various applications. Examples thereof are as follows: a base film for preventing an impurity such as sodium contained in a glass substrate from diffusing into a semiconductor layer of a TFT, a gate insulating film of a TFT, an interlayer insulating film for insulating and separating wirings from one another, a passivation film for protecting a surface, a capacitor insulating film of a memory cell, and the like.

In recent years, miniaturization and multi-layering of an element or a wiring have been required in order to realize higher integration and miniaturization of a semiconductor integrated circuit. An interlayer insulating film is provided to insulate wirings from each other. When a wiring, an electrode, or the like is further formed over the interlayer insulating film, the surface of the interlayer insulating film needs to be planar.

As the insulating film having planarity, an SOG film is known (for example, Reference 1: Japanese Patent Application Laid-Open No. 10-242277).

The SOG film refers to an insulating film formed by applying and then heat-treating (baking) a solution in which a silicon compound is diluted with a solvent. The SOG film is roughly divided into two types: an organic SOG film which contains an organic component in a silicon compound and an inorganic SOG film which does not contain an organic component in a silicon compound.

A resin containing a siloxane polymer can be given as an example of the SOG film. An insulating film obtained by baking the resin containing a siloxane polymer has a characteristic of having higher heat resistance than that obtained by baking a resin not containing a siloxane polymer.

The baking after applying the resin containing a siloxane polymer is conventionally performed in the atmosphere. At this time, there is a problem in that a crack is generated in the formed insulating film. In particular, the crack generation is notable in a region where the insulating film has a thickness of 1 µm or more. Note that the atmosphere means an atmosphere including nitrogen of approximately 78.1% (volume ratio) and oxygen of approximately 20.9% at room temperature (at approximately 15° C. in terms of the global mean temperature).

In order to prevent this crack generation, methods can be considered such as setting the thickness of the insulating film at 1 µm or less and adjusting resin components. However, using these methods, there are problems of poor insulation due to thin thickness of the insulating film or uneven application due to the change in resin components.

SUMMARY OF THE INVENTION

In view of the above problems, it is an object of the present invention to provide a semiconductor device with an insulating film in which crack generation is suppressed and which has favorable insulation and planarity even in a thick region.

It is another object to provide an electronic device incorporating the semiconductor device. Note that, in this specification, the semiconductor device refers to a device which can be operated by using semiconductor characteristics. Specifically, a display device typified by a liquid crystal display device or an EL display device can be given as an example thereof.

The present invention solves the above-described problems by the following means. In other words, an insulating film in which crack generation is suppressed can be formed by performing heat treatment at the time of baking a resin containing a siloxane polymer after application, in an atmosphere including an inert gas as its main component and having an oxygen ($O_2$) concentration of 5% or less and a water ($H_2O$) concentration of 1% or less. The heat treatment is preferably performed in an atmosphere having an oxygen concentration of 1% or less (more preferably, 0.1% or less) and a water concentration of 0.1% or less, thereby obtaining a more notable effect.

The influence of an oxygen concentration and a water concentration in a heat-treatment atmosphere on the formation of an insulating film can be thought as follows.

An organic group such as an alkyl group, an aryl group, or an alkenyl group is contained in an insulating film obtained by heat-treating a resin containing a siloxane polymer. The organic group reacts with oxygen or water in the heat treatment atmosphere, and partially becomes gas such as $CO_2$ or $H_2O$ and detaches. Consequently, it is thought that the volume of the insulating film decreases and the crack tends to be generated. In addition, the organic group such as an alkyl group, an aryl group, or an alkenyl group has an effect of relaxing stress. It is thought that the stress relaxation effect is lessened when the organic group reacts with oxygen or water in the heat treatment atmosphere; thus, the crack tends to be generated.

One feature of the invention regarding a method for manufacturing a semiconductor device, which is disclosed in this specification, is to comprise the steps of: forming (or applying) a resin containing a siloxane polymer; and forming an insulating film by heat-treating the resin in an atmosphere containing an inert gas as its main component and having an oxygen concentration of 5% or less and a water concentration of 1% or less.

Another feature of the invention regarding a method for manufacturing a semiconductor device, which is disclosed in this specification, is to comprise the steps of: forming a base film over an insulating substrate; forming over the base film a TFT which includes a semiconductor layer having a source region, a drain region, and a channel formation region, a gate insulating film, and a gate electrode; forming a first interlayer insulating film over the gate insulating film and the gate electrode; forming a first contact hole in the first interlayer insulating film; forming a wiring over the first interlayer insulating film to connect to the source region or the drain region through the first contact hole; forming (or applying) a resin containing a siloxane polymer over the first interlayer insulating film and the wiring; forming a second interlayer insulating film by heat-treating the resin in an atmosphere containing an inert gas as its main component and having an oxygen concentration of 5% or less and a water concentration of 1% or less; forming a second contact hole in the second interlayer insulating film; and forming an electrode over the second interlayer insulating film to connect to the wiring through the second contact hole.

Another feature of the invention regarding a method for manufacturing a semiconductor device, which is disclosed in this specification, is to comprise the steps of: forming a base film over an insulating substrate; forming an amorphous semiconductor film over the base film; forming a crystalline semiconductor film by crystallizing the amorphous semiconductor film; forming a semiconductor layer by patterning the crystalline semiconductor film; forming a gate insulating film over the semiconductor layer; forming a gate electrode over the gate insulating film; forming a first impurity region and a second impurity region by doping the semiconductor layer, using the gate electrode as a mask; forming a first interlayer insulating film over the gate insulating film and the gate electrode; forming a first contact hole in the first interlayer insulating film; forming a wiring over the first interlayer insulating film to connect to the first impurity region through the first contact hole; forming (or applying) a resin containing a siloxane polymer over the first interlayer insulating film and the wiring; forming a second interlayer insulating film by heat-treating the resin in an atmosphere containing an inert gas as its main component and having an oxygen concentration of 5% or less and a water concentration of 1% or less; forming a second contact hole in the second interlayer insulating film; and forming an electrode over the second interlayer insulating film to connect to the wiring through the second contact hole.

Heat treatment may accompany a step after forming the insulating film by heat-treating the resin containing a siloxane polymer. In the invention, heat treatment which is performed after forming the insulating film obtained by heat-treating the resin containing a siloxane polymer is performed in an atmosphere containing an inert gas as its main component and having an oxygen concentration of 5% or less and a water concentration of 1% or less. Accordingly, crack generation can be prevented even after forming the insulating film.

Another feature of the invention regarding a method for manufacturing a semiconductor device, which is disclosed in this specification, is to comprise the steps of: forming a base film over an insulating substrate; forming over the base film a TFT which includes a semiconductor layer having a source region, a drain region, and a channel formation region, a gate insulating film, and a gate electrode; forming a first interlayer insulating film over the gate insulating film and the gate electrode; forming a first contact hole in the first interlayer insulating film; forming a wiring over the first interlayer insulating film to connect to the source region or the drain region through the first contact hole; forming (or applying) a resin containing a siloxane polymer over the first interlayer insulating film and the wiring; forming a second interlayer insulating film by heat-treating the resin in an atmosphere containing an inert gas as its main component and having an oxygen concentration of 5% or less and a water concentration of 1% or less; forming a second contact hole in the second interlayer insulating film; forming an electrode over the second interlayer insulating film to connect to the wiring through the second contact hole; and heat-treating the resin in an atmosphere containing an inert gas as its main component and having an oxygen concentration of 5% or less and a water concentration of 1% or less.

Another feature of the invention regarding a method for manufacturing a semiconductor device, which is disclosed in this specification, is to comprise the steps of: forming a base film over an insulating substrate; forming over the base film a TFT which includes a semiconductor layer having a source region, a drain region, and a channel formation region, a gate insulating film, and a gate electrode; forming a first interlayer insulating film over the gate insulating film and the gate electrode; forming a first contact hole in the first interlayer insulating film; forming a wiring over the first interlayer insulating film to connect to the source region or the drain region through the first contact hole; forming (or applying) a resin containing a siloxane polymer over the first interlayer insulating film and the wiring; forming a second interlayer insulating film by heat-treating the resin in an atmosphere containing an inert gas as its main component and having an oxygen concentration of 5% or less and a water concentration of 1% or less; forming a second contact hole in the second interlayer insulating film; forming a first electrode over the second interlayer insulating film to connect to the wiring through the second contact hole; heat-treating the resin in an atmosphere containing an inert gas as its main component and having an oxygen concentration of 5% or less and a water concentration of 1% or less; forming an insulating film to cover a part of the first electrode; heat-treating the resin in an atmosphere containing an inert gas as its main component and having an oxygen concentration of 5% or less and a water concentration of 1% or less; forming an electroluminescent layer to cover a region of the first electrode, which is not covered with the insulating film; and forming a second electrode over the electroluminescent layer.

In the above features of the invention, a difference in thickness from the insulating substrate to the top surface of the wiring or the first interlayer insulating film between the thickest part and the thinnest part is 300 nm or more.

In the second interlayer insulating film according to the above feature of the invention, the thickest part has a thickness of 1.0 μm or more.

Another feature of the invention regarding a method for manufacturing a semiconductor device, which is disclosed in this specification, is to comprise the steps of: forming a base film over an insulating substrate; forming an amorphous semiconductor film over the base film; forming a crystalline semiconductor film by crystallizing the amorphous semiconductor film; forming a semiconductor layer by patterning the crystalline semiconductor film; forming a gate insulating film over the semiconductor layer; forming a gate electrode over the gate insulating film; forming a first impurity region and a second impurity region by doping the semiconductor layer, using the gate electrode as a mask; forming a film of an inorganic insulating material over the gate insulating film and the gate electrode; forming (or applying) a resin containing a siloxane polymer over the film formed of an inorganic insulating material; forming an insulating film by heat-treating the resin in an atmosphere containing an inert gas as its main component and having an oxygen concentration of 5% or less and a water concentration of 1% or less; forming a contact hole in the film formed of an inorganic insulating material and the insulating film; and forming a wiring over the film formed of an inorganic insulating material and the insulating film to connect to the first impurity region through the contact hole.

Another feature of the invention regarding a method for manufacturing a semiconductor device, which is disclosed in this specification, is to comprise the steps of: forming a base film over an insulating substrate; forming an amorphous semiconductor film over the base film; forming a crystalline semiconductor film by crystallizing the amorphous semiconductor film; forming a semiconductor layer by patterning the crystalline semiconductor film; forming a gate insulating film over the semiconductor layer; forming a gate electrode over the gate insulating film; forming a first impurity region and a second impurity region by doping the semiconductor layer, using the gate electrode as a mask; forming a film of an inorganic insulating material over the gate insulating film and the gate electrode; forming (or applying) a resin containing a siloxane polymer over the film formed of an inorganic insulating material; forming an insulating film by heat-treating the resin in an atmosphere containing an inert gas as its main component and having an oxygen concentration of 5% or less and a water concentration of 1% or less; forming a contact hole in the film formed of an inorganic insulating material and the insulating film; forming a wiring over the film formed of an inorganic insulating material and the insulating film to connect to the first impurity region through the contact hole; and forming an electrode to overlap a part of the wiring.

In the above feature of the invention, the resin containing a siloxane polymer includes a methyl group and a phenyl group.

In the above feature of the invention, the inert gas contains nitrogen ($N_2$).

According to the present invention, an insulating film, in which crack generation is suppressed and which has favorable insulation and planarity even in a thick region, can be formed. Preferably, heat treatment is performed in an atmosphere having an oxygen concentration of 1% or less (more preferably, 0.1% or less) and a water concentration of 0.1% or less, thereby obtaining a more notable effect.

According to the invention, even when heat treatment is performed after forming the insulating film in which crack generation is suppressed, crack generation in the insulating film can be prevented. Consequently, a semiconductor device having the insulating film can be manufactured at low cost and with high yield.

BRIEF DESCRIPTION OF DRAWINGS

FIGS. 8A to 8D show a method for manufacturing a semiconductor device of the invention (Embodiment Mode 6).

FIGS. 9A and 9B show a method for manufacturing a semiconductor device of the invention (Embodiment Mode 6).

FIGS. 10A to 10C show a method for manufacturing a semiconductor device of the invention (Embodiment Mode 6).

FIGS. 15A and 15B show a semiconductor device of the invention (Embodiment Mode 7).

DETAILED DESCRIPTION OF THE INVENTION

Figure 1A:
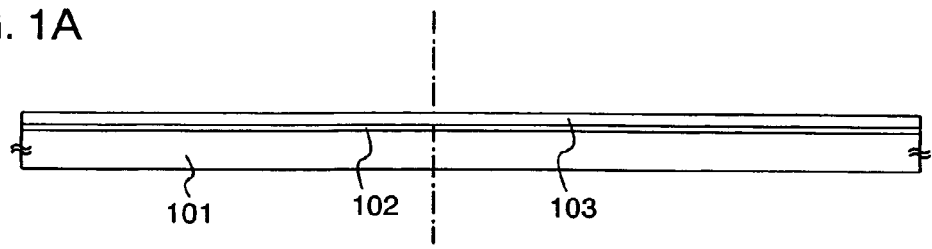
FIGS. 1A to 1D show a method for manufacturing a semiconductor device of the invention (Embodiment Mode 1).

The best mode for carrying out the invention will be explained with reference to the drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of the embodiment mode. Note that the same reference numeral is given to the same portion or a portion having a similar function among different drawings in a structure of the present invention to be described hereinafter, and repetitive description is omitted.

Embodiment Mode 1

In this embodiment mode, a step of forming an insulating film using a resin containing a siloxane polymer is explained with reference to FIGS. 1A to 2B.

First, a base film 102 is formed over an insulating substrate 101 as shown in FIG. 1A. The insulating substrate 101 may be a glass substrate of, for example, barium-borosilicate glass, alumino-borosilicate glass, or the like, a quartz substrate, a ceramic substrate, or the like. Although a substrate made from a synthetic resin having flexibility, such as plastics, generally tends to have lower heat-resistance than the above-described substrate, it can be used as the insulating substrate 101 as long as it can withstand the process temperature in the manufacturing step. The surface of the insulating substrate 101 may be polished by a CMP method to be planarized.

The base film 102 may be formed by a known method such as a CVD method typified by a plasma CVD method or a low pressure CVD method, or a sputtering method. The base film may have a single-layer structure using any one of a silicon oxide film, a silicon nitride film, a silicon oxynitride film, and a silicon nitride oxide film, or may have an appropriately laminated structure thereof. In this specification, silicon oxynitride refers to a substance having a higher composition ratio of oxygen than that of nitrogen, and can also be referred to as silicon oxide containing nitrogen. In addition, in this specification, silicon nitride oxide refers to a substance having a higher composition ratio of nitrogen than that of oxygen, and can also be referred to as silicon nitride containing oxygen. In this embodiment mode, a silicon nitride oxide film with a thickness of 50 nm and a silicon oxynitride film with a thickness of 100 nm are laminated as the base film.

Subsequently, a semiconductor film 103 is formed over the base film 102. The semiconductor film 103 may be an amorphous semiconductor film. It may alternatively be a microcrystalline semiconductor film or a crystalline semiconductor film. There is no limitation on materials of the semiconductor film, but silicon or silicon germanium (SiGe) is preferably used. In this embodiment mode, an amorphous silicon film is formed to have a thickness of 54 nm. Note that a step of removing hydrogen contained in the semiconductor film may be performed after forming the semiconductor film. Specifically, the semiconductor film may be heated at a temperature of 500° C. for one hour.

When the base film 102 and the semiconductor film 103 are formed in such a manner as not to expose to air an interface between the base film 102 and the semiconductor film 103, contamination of the interface can be prevented and variations in characteristics of a TFT to be manufactured can be reduced. In this embodiment mode, the base film 102 and the semiconductor film 103 are continuously formed by a plasma CVD method without being exposed to air.

Next, the semiconductor film 103 is crystallized by a known method (a laser crystallization method, a thermal crystallization method, a thermal crystallization method using an element such as nickel which promotes crystallization, or the like) to form a crystalline semiconductor film 104. Here, after the crystallization, the crystalline semiconductor film 104 may be entirely doped with an impurity, such as boron (B), which imparts p-type conductivity to perform channel doping on a region in the TFT to be a channel formation region, thereby controlling threshold voltage of the TFT.

Figure 1B:
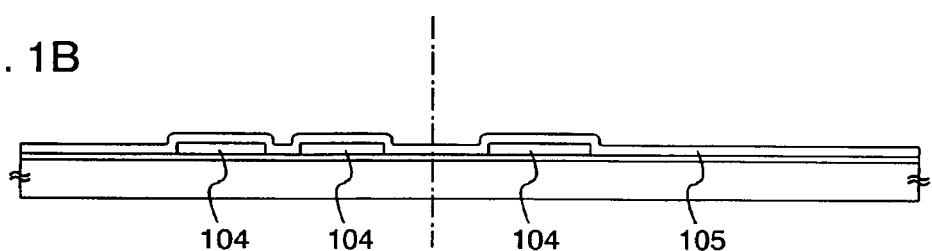

Subsequently, after patterning the crystalline semiconductor film 104, a gate insulating film 105 is formed as shown in FIG. 1B. The gate insulating film 105 may have a single-layer structure using any one of a silicon oxide film, a silicon nitride film, a silicon oxynitride film, and a silicon nitride oxide film, or may have an appropriately laminated structure thereof. In this embodiment mode, the gate insulating film is formed by lamination to have a thickness of 110 nm.

Figure 1C:
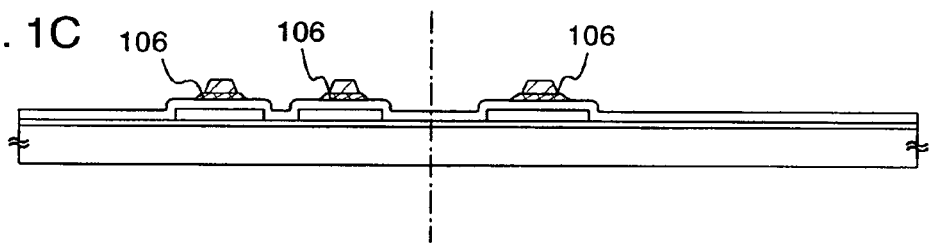

Then, a gate electrode 106 is formed over the gate insulating film 105 as shown in FIG. 1C. The gate electrode 106 can be formed of metal such as Al, Mo, or W, and may have a single-layer structure of this metal or a laminated structure thereof. Alternatively, a polysilicon film may be used as the gate electrode 106. In this embodiment mode, a tantalum nitride (TaN) film with a thickness of 30 nm and a tungsten (W) film with a thickness of 370 nm are laminated. At this time, the TaN film is preferably formed to be wider than the W film by 0.5 μm to 1.5 μm.

Subsequently, the crystalline semiconductor film 104 is doped with an impurity such as boron (B) which imparts p-type conductivity, using the gate electrode 106 as a mask. With this step, a source region and a drain region of the TFT can be formed in a self-aligned manner. In this embodiment mode, a low concentration impurity region (LDD region) is formed between the channel formation region, and the source region and the drain region by a known doping method. However, it may not be provided.

After the doping, heat treatment, intense light irradiation, or laser light irradiation may be performed to activate the impurity element added to the impurity region. This can repair plasma damage to the gate insulating film 105 and the interface between the gate insulating film 105 and a semiconductor layer in addition to activating the impurity element.

Figure 1D:
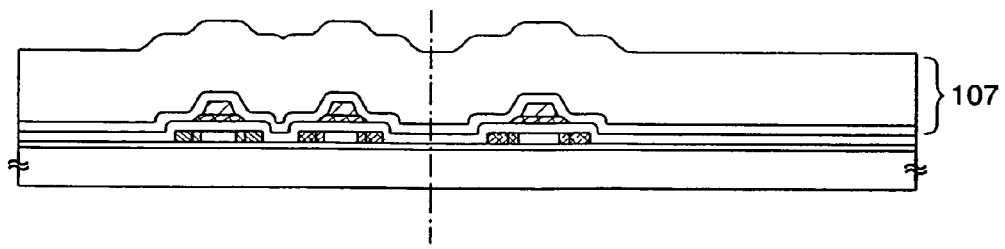

Next, a first interlayer insulating film 107 is formed over the gate insulating film 105 and the gate electrode 106 as shown in FIG. 1D. In this embodiment mode, a silicon nitride oxide film with a thickness of 100 nm and a silicon oxynitride film with a thickness of 900 nm are laminated.

After forming the first interlayer insulating film 107, it is preferable to perform a step of hydrogenating the patterned crystalline semiconductor film 104 (semiconductor layer) by performing heat treatment at 300° C. to 550° C. (more preferably, 400° C. to 500° C.) for 1 to 12 hours in a nitrogen atmosphere. With this step, dangling bonds in the semiconductor layer can be terminated by hydrogen contained in the first interlayer insulating film 107. In this embodiment mode, the heat treatment is performed at 410° C. for one hour.

Figure 2A:
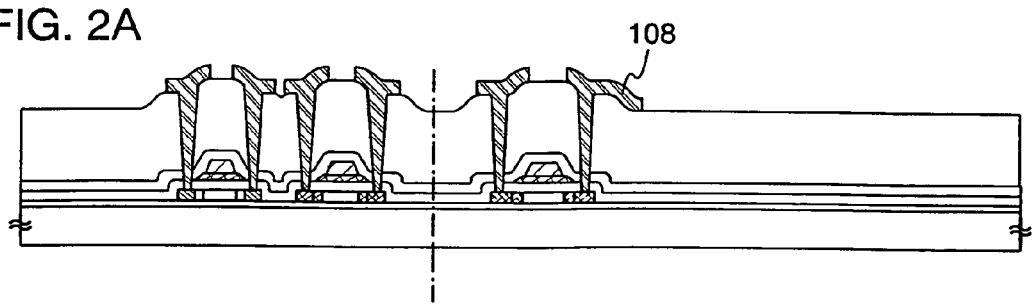
FIGS. 2A and 2B show a method for manufacturing a semiconductor device of the invention (Embodiment Mode 1).

Then, a contact hole is formed in the first interlayer insulating film 107 to reach the source region and the drain region of the TFT as shown in FIG. 2A. The contact hole may have a tapered shape.

A wiring 108 (electrode) is formed to cover the contact hole. The wiring 108 serves as a source electrode or a drain electrode. The wiring 108 is formed using metal such as Ag, Au, Cu, Ni, Pt, Pd, Ir, Rh, W, Al, Ta, Mo, Cd, Zn, Fe, Ti, Si, Ge, Zr, or Ba, an alloy thereof, or metal nitride thereof. In addition, it may have a laminated structure thereof. In this embodiment mode, a titanium (Ti) film with a thickness of 100 nm, an alloy film of aluminum and silicon (Al—Si) with a thickness of 700 nm, and a titanium (Ti) film with a thickness of 200 nm are formed and patterned into a desired shape.

Figure 2B:
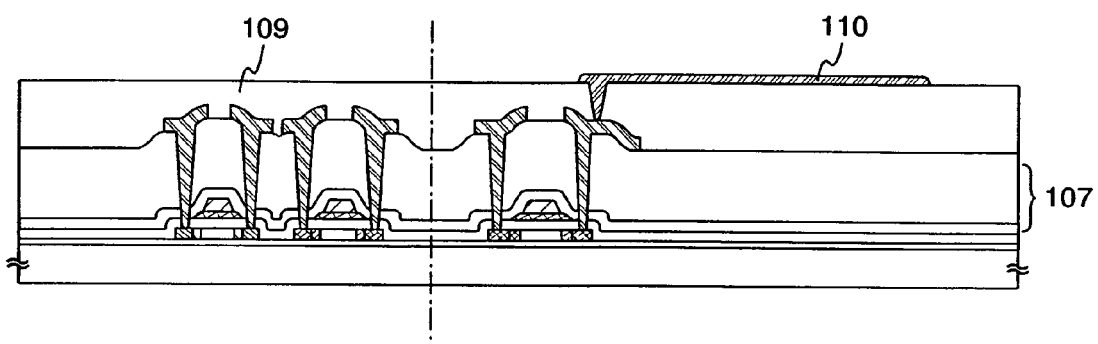

A second interlayer insulating film 109 is formed over the first interlayer insulating film 107 and the wiring 108 as shown in FIG. 2B. An insulating film obtained by baking a resin containing a siloxane polymer is used as the second interlayer insulating film 109. In this embodiment mode, described is the second interlayer insulating film having a single-layer structure of the insulating film obtained by baking a resin containing a siloxane polymer. However, the second interlayer insulating film may have a laminated structure including the insulating film obtained by baking a resin containing a siloxane polymer as a top layer. The siloxane polymer preferably includes a phenyl group.

An application film using a material which has a skeleton configured by the bond of silicon (Si) and oxygen (O) and includes an organic group containing at least hydrogen (for example, an alkyl group or an aromatic hydrocarbon) as a substituent or includes a fluoro-group as a substituent is used for the insulating film obtained by baking the resin containing a siloxane polymer. The film after baking can also be referred to as a silicon oxide ($SiO_x$) film including an alkyl group. The silicon oxide ($SiO_x$) film including an alkyl group has a highly light transmitting property and can withstand heat treatment at 300° C. or more. In addition, a silicon oxide film, a silicon nitride film, a silicon oxynitride film, a silicon nitride oxide film, or the like can also be combined appropriately. In this embodiment mode, the insulating film obtained by baking a resin containing a siloxane polymer is formed to have a thickness of 1.3 μm.

Here, a method for forming the insulating film by baking a resin containing a siloxane polymer is explained. First, thinner pre-wet treatment is performed to improve wettability after washing with purified water. Then, a composition including an insulating material in which a low molecular weight component (a precursor) having the bond of silicon (Si) and oxygen (O) is dissolved into a solvent is applied over the substrate from an application apparatus. In this embodiment mode, applied is a resin containing a siloxane polymer of 20% to 40% and using 3-methoxy-3-methyl-1-butanol as a solvent. Thereafter, an insulating film can be obtained by heating the composition together with the substrate to promote volatilization (evaporation) of the solvent and cross-linking reaction of the low molecular weight component. Then, an application film on the periphery of an end face of the substrate provided with the application film is removed. Note that a film thickness is controlled by the number of spin rotation, rotational time, and concentration and viscosity of the composition including an insulating material, which is an application material liquid. In this embodiment mode, application is performed for 17 seconds with the number of rotation of 1000 rpm after discharging the composition of 40 ml. Then, heat treatment is performed after applying the resin to form the insulating film. This heat treatment is performed in an atmosphere containing an inert gas as its main component and having an oxygen concentration of 5% or less and a water concentration of 1% or less. Preferably, an oxygen concentration is 1% or less (more preferably, 0.1% or less) and a water concentration is 0.1% or less. By controlling the concentration of oxygen and water in the heat treatment atmosphere as in the present invention, it becomes possible to prevent decrease in volume of the insulating film or lessening of a stress relaxation effect the organic group has due to the reaction of oxygen and water in the heat treatment atmosphere with the organic group included in the insulating film.

Consequently, a favorable insulating film in which crack generation is suppressed can be formed. The heat treatment is performed at 350° C. for one hour. The baking may be performed in a chamber under atmospheric pressure or reduced pressure. In this embodiment mode, the second interlayer insulating film 109 is 1.5 μm or more thick in the thickest part and 0.4 μm thick in the thinnest part. The thickest part corresponds to a contact portion of the wiring 108 or the periphery of the wiring 108, and the thinnest part corresponds to an upper portion of the wiring 108.

When the thickest part of the second interlayer insulating film 109 is 1.0 μm or more thick, the crack tends to be generated particularly by performing heat treatment or the like in the following step. Therefore, it is extremely effective to apply the invention when the thickest part is 1.0 μm or more thick as described in the example of this embodiment mode.

After forming a contact hole in the second interlayer insulating film 109, a first electrode 110 is formed to electrically connect to the wiring 108 through the contact hole. Indium tin oxide containing silicon oxide (hereinafter referred to as "ITSO"), zinc oxide, tin oxide, indium oxide, or the like can be used for the first electrode 110. Alternatively, a transparent conductive film of an indium oxide zinc oxide alloy in which zinc oxide (ZnO) of 2% to 20% is mixed with indium oxide can be used. Other than the above transparent conductive film, a titanium nitride film or a titanium film may be used. In this case, after forming the transparent conductive film, a titanium nitride film or a titanium film is formed to have such a thickness as to transmit light (preferably, approximately 5 nm to 30 nm). In this embodiment mode, an ITSO film is formed as the first electrode 110 to have a thickness of 110 nm.

The first electrode 110 may be polished by a CMP method or by cleaning with a porous body of polyvinyl alcohol so that the surface thereof is planarized. Furthermore, ultraviolet irradiation or oxygen plasma treatment may be performed on the surface of the first electrode 110 after polishing the surface by the CMP method.

Heat treatment may be performed after forming the first electrode 110. This heat treatment can increase transmissivity of the transparent conductive film. Therefore, a highly reliable display device can be manufactured. In this embodiment mode, the heat treatment after forming the first electrode 110 is performed in an atmosphere containing an inert gas as its main component and having an oxygen concentration of 5% or less and a water concentration of 1% or less. Accordingly, in the second interlayer insulating film 109 obtained by baking a resin containing a siloxane polymer, crack generation due to the heat treatment after forming the first electrode 110 can be suppressed. In this embodiment mode, the heat treatment after forming the first electrode 110 is performed at 250° C. for one hour.

The steps of manufacturing a p-channel TFT are described in this embodiment mode. However, the present invention can also be applied when an n-channel TFT is manufactured by doping the crystalline semiconductor film 104 with an impurity which imparts n-type conductivity, using the gate electrode as a mask. In addition, the invention can also be applied when a p-channel TFT and an n-channel TFT are manufactured over the same substrate.

The TFT may have a single gate structure provided with one channel formation region, a double gate structure provided with two channel formation regions, or a triple gate structure provided with three channel formation regions. A TFT in a peripheral driver circuit region may also have a single gate structure, a double gate structure, or a triple gate structure.

Without limiting to the method for manufacturing the TFT described in this embodiment mode, the present invention can be applied to the manufacturing of a top gate type (planar type), a bottom gate type (inversely staggered type), a dual gate type having two gate electrodes located above and below a channel region with a gate insulating film therebetween, or the like.

With the above described steps, a TFT having an insulating film obtained by baking a resin containing a siloxane polymer, manufactured according to the invention, can be manufactured.

Embodiment Mode 2

In this embodiment mode, a method for manufacturing a display device having an electroluminescent element (hereinafter referred to as "EL element") (EL display device) using the TFT manufactured in Embodiment Mode 1 is explained.

In this embodiment mode, light from the EL element is to be extracted through a first electrode 110. Thus, the first electrode 110 is formed using a light-transmitting film. In this embodiment mode, indium tin oxide containing silicon oxide (ITSO) is used for the first electrode 110 as in Embodiment Mode 1.

Figure 3:
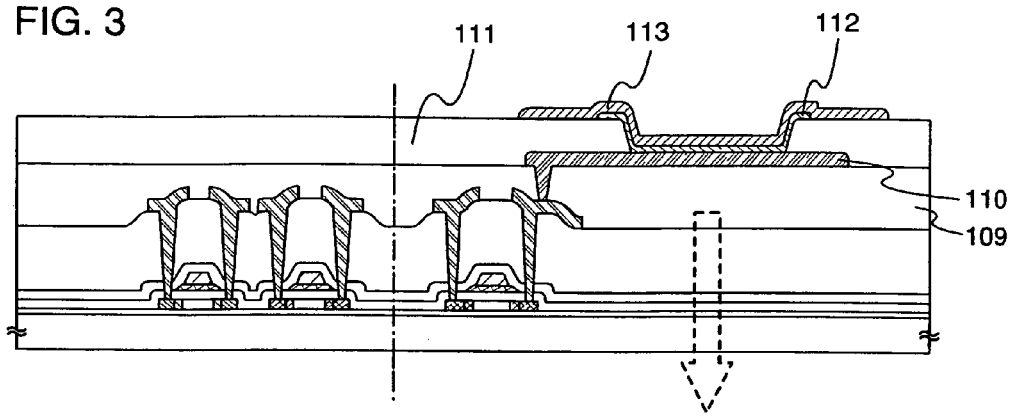
FIG. 3 shows a semiconductor device manufactured according to the invention (Embodiment Mode 2).

First, as shown in FIG. 3, an insulating film 111 (referred to as a bank, a partition, a barrier, a mound, or the like) is formed to cover an end of the first electrode 110 and the TFT.

The insulating film 111 can be formed of an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular weight material such as polyimide, aromatic polyamide, or polybenzimidazole; an inorganic siloxane-based insulating material including a Si—O—Si bond among compounds that contain silicon, oxygen, and hydrogen and are formed by using a siloxane-based material as a starting material; or an organic siloxane-based insulating material in which hydrogen bonded with silicon is substituted by an organic group such as a methyl group or a phenyl group. It may be formed using a photosensitive or non-photosensitive material such as acrylic or polyimide. In this embodiment mode, the insulating film 111 is formed using photosensitive polyimide with a thickness of 1.5 μm in a planar region.

The insulating film 111 preferably has such a shape that a curvature radius continuously changes, thereby improving the coverage of an electroluminescent layer 112 (a layer containing an organic compound) and a second electrode 113 to be formed over the insulating film 111.

Heat treatment is preferably performed before forming the electroluminescent layer 112 in order to further improve reliability. Moisture contained in or attached to the first electrode 110 or the insulating film 111 is preferably released by the heat treatment.

This heat treatment is conventionally performed in an oxygen atmosphere. However, in this embodiment mode, the heat treatment is performed in an atmosphere containing an inert gas as its main component and having an oxygen concentration of 5% or less and a water concentration of 1% or less. By controlling the concentration of oxygen and water in the heat treatment atmosphere as in the present invention, it becomes possible to prevent decrease in volume of the insulating film or lessening of a stress relaxation effect the organic group has due to the reaction of oxygen and water in the heat treatment atmosphere with the organic group included in the insulating film. Accordingly, in the insulating film obtained by baking a resin containing a siloxane polymer, crack generation due to the heat treatment can be suppressed. In this embodiment mode, the heat treatment is performed at 300° C. for one hour.

Next, the electroluminescent layer 112 is formed over the first electrode 110. Although only one pixel is shown in FIG. 3, electroluminescent layers corresponding to each color of red (R), green (G), and blue (B) are separately formed in this embodiment mode. In this embodiment mode, the electroluminescent layer 112 is formed by selectively forming each material which emits light of red (R), green (G), or blue (B) by an evaporation method using an evaporation mask. Each material which emits light of red (R), green (G), or blue (B) can be selectively formed by an evaporation method using an evaporation mask or by a droplet discharge method. The droplet discharge method has an advantage in that coloring of RGB can be separately performed without using a mask. In this embodiment mode, each material which emits light of red (R), green (G), or blue (B) is formed by an evaporation method.

Note that, before evaporating electroluminescent materials, heat treatment is preferably performed in an atmosphere containing an inert gas as its main component and having an oxygen concentration of 5% or less and a water concentration of 1% or less to remove moisture or the like. In this embodiment mode, the heat treatment is performed at 300° C. for one hour.

Then, the second electrode 113 formed with a conductive film is formed over the electroluminescent layer 112. A material having a low work function (Al, Ag, Li, Ca, or an alloy thereof, that is, MgAg, MgIn, AlLi, $CaF_2$, or CaN) may be used for the second electrode 113. Thus, a light emitting element including the first electrode 110, the electroluminescent layer 112, and the second electrode 113 is formed.

In the display device shown in FIG. 3, light from the light emitting element is transmitted through a film formed between the insulating substrate 101 and the first electrode 110, and emitted in an arrow direction through the first electrode 110.

It is effective to provide a passivation film so as to cover the second electrode 113. The passivation film can have a single-layer structure or a laminated structure of an insulating film containing silicon nitride, silicon oxide, silicon oxynitride (SiON), silicon nitride oxide (SiNO), aluminum nitride (AlN), aluminum oxynitride (AlON), aluminum nitride oxide having larger nitrogen content than oxygen content (AlNO), aluminum oxide, diamond like carbon (DLC), or a nitrogen-containing carbon film (CN). In addition, a material may be used which has a skeleton configured by the bond of silicon (Si) and oxygen (O) and includes an organic group containing at least hydrogen (for example, an alkyl group or aromatic hydrocarbon) as a substituent or includes a fluoro group as a substituent.

In this case, a film having favorable coverage is preferably used as the passivation film, and it is effective to use a carbon film, particularly, a DLC film. Since the DLC film can be formed at a temperature ranging from room temperature to 100° C., it can be easily formed over the electroluminescent layer 112 having low heat resistance. The DLC film has a high blocking effect against oxygen and can suppress oxidation of the electroluminescent layer 112. Therefore, a problem of oxidization of the electroluminescent layer 112 during the following sealing step can be prevented.

Subsequently, the light emitting element is sealed by fixing the insulating substrate 101 provided with the light emitting element to a sealing substrate by means of a sealant. Since the moisture entry from a section can be prevented by the sealant, the light emitting element can be prevented from deteriorating and reliability of the display device can be increased. Note that a region surrounded by the sealant may be filled with a filler, or nitrogen or the like may be included by sealing in a nitrogen atmosphere. The filler can fill the display device by being dropped in a liquid state. Since the light emitting element in this embodiment mode is a bottom emission type, a light-transmitting filler need not be used. However, when light is extracted through the filler, the filler needs to be formed using a light-transmitting material. One example of the filler is a visible-light curing, ultraviolet curing, or thermosetting epoxy resin. According to the above steps, the display device having the light emitting element is completed.

In order to prevent the element from deteriorating due to moisture, a drying agent is preferably provided in an EL display panel. In this embodiment mode, the drying agent is provided in a depression formed in the sealing substrate to surround a pixel region, so as not to interfere with thinning. In addition, a water absorption area can be enlarged by also providing a region corresponding to a gate wiring layer with a drying agent, thereby enhancing a water absorption effect. Since the drying agent is formed over the gate wiring layer where light emission of the light emitting element does not directly affect, the light extraction efficiency is not decreased.

In this embodiment mode, the case of sealing the light emitting element with a glass substrate is explained. Sealing is a process for protecting the light emitting element from moisture, and is performed using any of the following methods: a mechanical method using a cover member; a method using a thermosetting resin or an ultraviolet curing resin; and a method using a thin film having a high barrier property of metal oxide, metal nitride, or the like. The cover member can be formed of glass, ceramic, plastic, or metal, but when light is emitted through the cover member, the cover member needs to have a light-transmitting property. The cover member is attached to the substrate provided with the light emitting element by means of a sealant such as a thermosetting resin or an ultraviolet curing resin, and the resin is cured by heat treatment or ultraviolet irradiation treatment, thereby forming enclosed space. It is also effective to provide an absorbent typified by barium oxide in this enclosed space. The absorbent may be provided on the sealant, or over the partition or the periphery thereof which does not interfere with light from the light emitting element. Further, space between the cover member and the substrate provided with the light emitting element can be filled with a thermosetting resin or an ultraviolet curing resin. In this case, it is effective to add an absorbent typified by barium oxide to the thermosetting resin or the ultraviolet curing resin.

According to the invention, a highly reliable display device can be manufactured. Therefore, a high-definition and high-quality display device can be manufactured at low cost and with high yield.

Embodiment Mode 3

Another embodiment mode of the invention is explained with reference to FIGS. 6 and 7. This embodiment mode describes an example of using the invention without forming the second interlayer insulating film 109 in the display device manufactured in Embodiment Mode 1. Therefore, repetitive description of the same portion or a portion having a similar function is omitted.

Since the steps up to forming the gate electrode 106 are the same as those explained in Embodiment Mode 1, steps thereafter are described.

Figure 6:
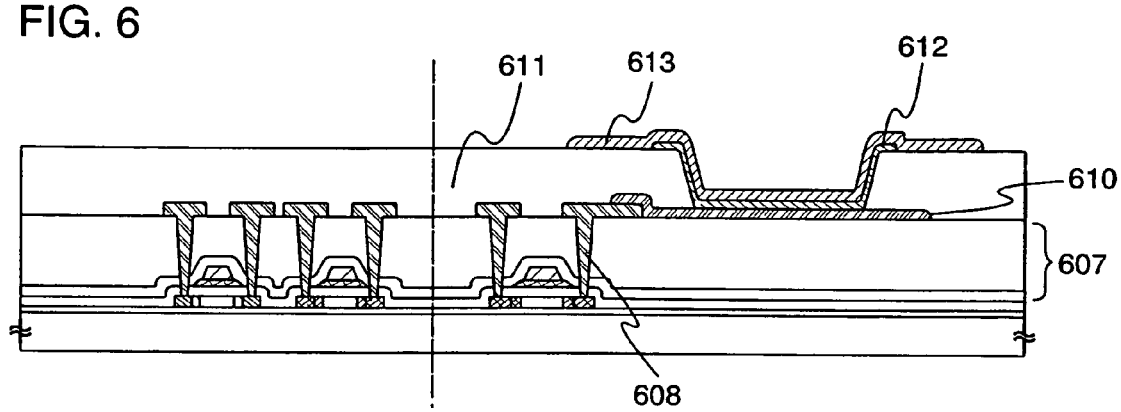
FIG. 6 shows a semiconductor device manufactured according to the invention (Embodiment Mode 3).

First, a first interlayer insulating film 607 is formed over the gate insulating film 105 and the gate electrode 106 as shown in FIG. 6. In this embodiment mode, the first interlayer insulating film 607 is formed to have a two-layer structure of a silicon nitride oxide film and an insulating film obtained by baking a resin containing a siloxane polymer. In place of the silicon nitride oxide film, a film of an inorganic insulating material such as silicon oxide, silicon nitride, silicon oxynitride, aluminum oxide, aluminum nitride, or aluminum oxynitride may be used.

The insulating film obtained by baking the resin containing a siloxane polymer is formed by performing heat treatment after applying the resin. The heat treatment is performed in an atmosphere containing an inert gas as its main component and having an oxygen concentration of 5% or less and a water concentration of 1% or less. Preferably, an oxygen concentration is 1% or less (more preferably, 0.1%) and a water concentration is 0.1% or less. By controlling the concentration of oxygen and water in the heat treatment atmosphere as in the present invention, it becomes possible to prevent decrease in volume of the insulating film or lessening of a stress relaxation effect the organic group has due to reaction of oxygen and water in the heat treatment atmosphere with the organic group included in the insulating film. Accordingly, a favorable insulating film in which crack generation is suppressed can be formed. The heat treatment may be performed in a chamber under atmospheric pressure or reduced pressure.

Next, a contact hole is formed in the first interlayer insulating film 607 to reach the source region and the drain region of the TFT. The contact hole may have a tapered shape.

Subsequently, a wiring 608 (electrode) is formed to cover the contact hole. The wiring 608 serves as a source electrode or a drain electrode.

Then, after forming the wiring 608 to connect to the source region or the drain region in the semiconductor layer of the TFT, a first electrode 610 is formed to partially overlap the wiring 608.

The first electrode 610 serves as a pixel electrode and may be formed using the same material as the first electrode 110 in Embodiment Mode 2. In this embodiment mode, light is extracted through the first electrode 610 as in Embodiment Mode 2. Therefore, the first electrode 610 is formed of ITSO which is a transparent conductive film.

Subsequently, an insulating film 611 is formed to cover an end of the first electrode 610 and the TFT. The insulating film 611 may be formed using the same material as the insulating film 111 explained in Embodiment Mode 2, but in this embodiment mode, the insulating film 611 is formed using acrylic.

Then, an electroluminescent layer 612 is formed over the first electrode 610, and a second electrode 613 is laminated thereover, thereby forming a light emitting element. A passivation film is formed to cover the second electrode 613. Lastly, the insulating substrate 101 is attached to a sealing substrate by means of a sealant. Note that a region surrounded by the sealant may be filled with a filler.

Figure 7:
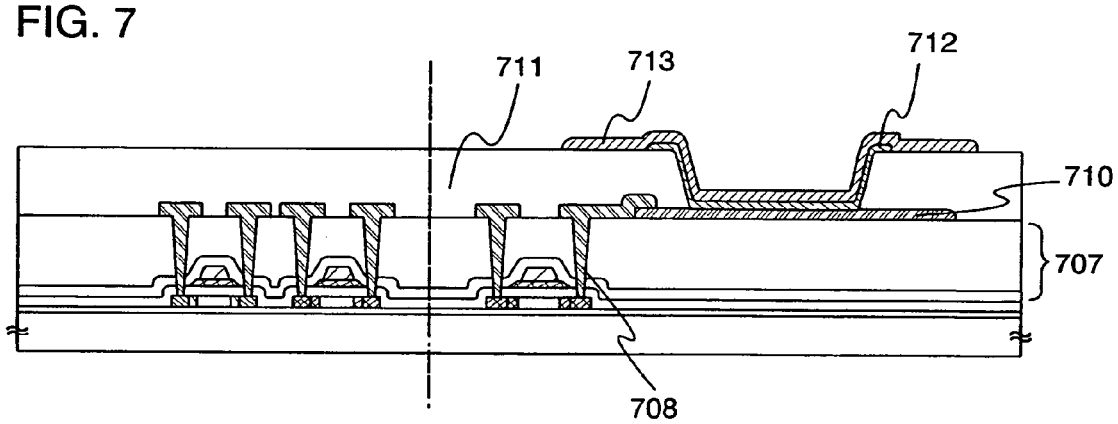
FIG. 7 shows a semiconductor device manufactured according to the invention (Embodiment Mode 3).

A display device shown in FIG. 7 has a structure in which a wiring 708 is connected to a first electrode 710 so that the wiring 708 partially overlaps the first electrode 710. In order to perform connection in such a manner, a contact hole may be formed in a first interlayer insulating film 707 after forming the first electrode 710 over the first interlayer insulating film 707 and the wiring 708 may be formed to partially overlap the first electrode 710. This structure can provide good coverage and film formability since the first electrode 710 can be formed over the insulating film obtained by baking a resin containing a siloxane polymer. Further, there is an advantage in that polishing treatment such as CMP can be fully performed on the first electrode 710 and the first electrode 710 can be formed with good planarity.

According to the invention, a highly reliable display device can be manufactured. Therefore, a high-definition and high-quality display device can be manufactured at low cost and with high yield.

Embodiment Mode 4

A display device having a light emitting element can be formed by applying the invention. Emission method of light from the light emitting element includes three types: a bottom emission type, a top emission type, and a dual emission type. In Embodiment Mode 2, an example of the bottom emission type, which is a single-side emission type, is described. But in this embodiment mode, examples of the dual emission type and the top emission type, which is a single-side emission type, are explained with reference to FIGS. 4 and 5.

Figure 4:
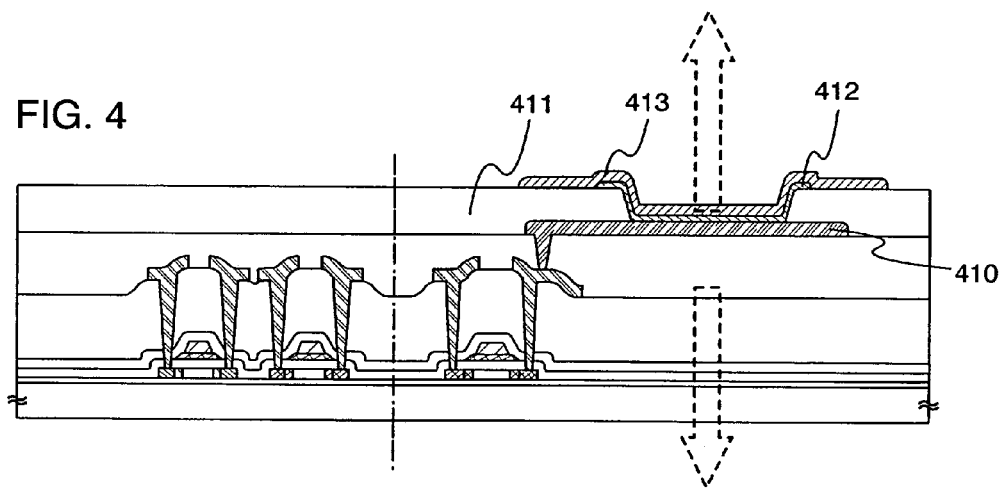
FIG. 4 shows a semiconductor device manufactured according to the invention (Embodiment Mode 4).

A display device shown in FIG. 4 is the dual emission type, and has a structure in which light is emitted in arrow directions both through a substrate provided with a light emitting element and through a sealing substrate. Note that, in this embodiment mode, a transparent conductive film is formed and etched into a desired shape, thereby forming a first electrode 410. The first electrode 410 can be formed using a transparent conductive film. In place of the transparent conductive film, a titanium nitride film or a titanium film may be used. In this case, after forming the transparent conductive film, a titanium nitride film or a titanium film is formed to have such a thickness as to transmit light (preferably, approximately 5 nm to 30 nm). In this embodiment mode, ITSO is used for the first electrode 410.

Next, a second electrode 413 formed of a conductive film is provided over an electroluminescent layer 412. Since the second electrode 413 is made to serve as a cathode, a material having a low work function (Al, Ag, Li, Ca, or an alloy thereof, that is, MgAg, MgIn, AlLi, $CaF_2$, or CaN) may be used for the second electrode 413. In the display device shown in FIG. 4, the second electrode 413 is formed with a laminated film of a thin metal film (MgAg film with a thickness of 10 nm) and a transparent conductive film (ITSO film with a thickness of 100 nm), which is formed to be thin so as to transmit light.

Figure 5:
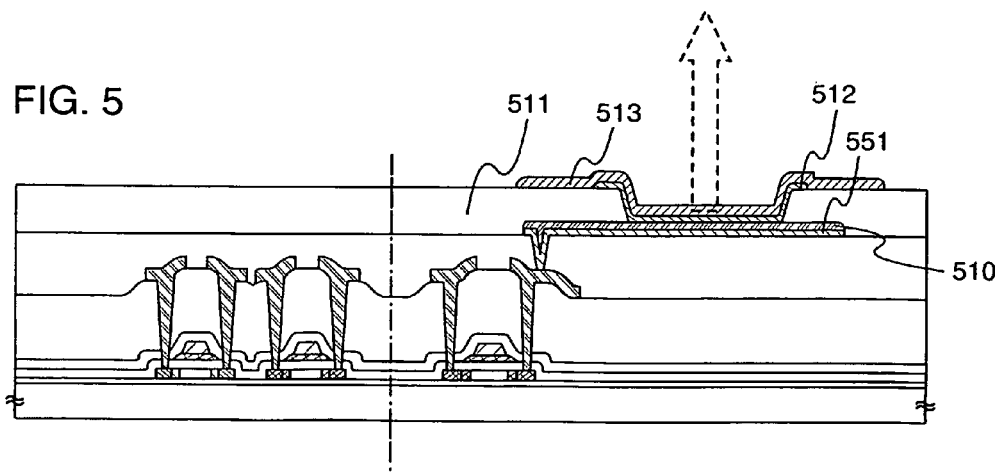
FIG. 5 shows a semiconductor device manufactured according to the invention (Embodiment Mode 4).

A display device shown in FIG. 5 is the single-side emission type and emits light upward in an arrow direction. It has a structure in which a reflective film is provided below the first electrode 410 in the dual emission display device shown in FIG. 4. In other words, as shown in FIG. 5, a first electrode 510 which is a transparent conductive film serving as an anode is provided over a reflective metal film 551. The reflective metal film may be formed using Ta, W, Ti, Mo, Al, Cu, or the like. It is preferable to use a material which is highly reflective particularly to visible light; in this embodiment mode, a TiN film is used. In addition, the structure of the invention is employed in the second interlayer insulating film 109, and the second interlayer insulating film 109 is formed to have favorable insulation and planarity. Thus, display by the light emitting element has high definition and no display unevenness.

A second electrode 513 formed of a conductive film is provided over an electroluminescent layer 512. Since the second electrode 513 is made to serve as a cathode, a material having a low work function (Al, Ag, Li, Ca, or an alloy thereof, that is, MgAg, MgIn, AlLi, $CaF_2$, or CaN) may be used for the second electrode 513. In this embodiment mode, the second electrode 513 has a laminated structure of a thin metal film (MgAg film with a thickness of 10 nm) and an ITSO film (with a thickness of 100 nm), which is formed to be thin so as to transmit light.

Embodiment Mode 5

A mode of a light emitting element which can be applied to the invention is explained. In the light emitting element, an electroluminescent layer is sandwiched between a first electrode and a second electrode. Materials of the first electrode and the second electrode need to be selected in consideration of work function. Each of the first electrode and the second electrode can be either an anode or a cathode depending on the pixel structure.

When polarity of a TFT is a p-channel type, the first electrode is preferably an anode and the second electrode is preferably a cathode. When polarity of the TFT is an n-channel type, the first electrode is preferably a cathode and the second electrode is preferably an anode.

Figure 14A:
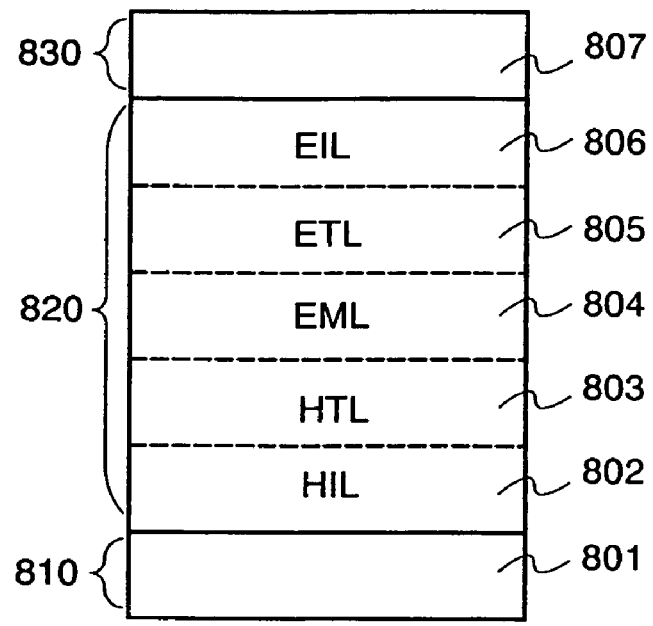
FIGS. 14A and 14B show structures of light emitting elements (Embodiment Mode 5).

When the first electrode 810 is an anode 801, and the second electrode 830 is a cathode 807 as shown in FIG. 14A, the electroluminescent layer 820 is preferably formed by sequentially laminating an HIL (hole injection layer) 802, an HTL (hole transport layer) 803, an EML (light emitting layer) 804, an ETL (electron transport layer) 805, an EIL (electron injection layer) 806, and the second electrode (cathode) 806 over the first electrode (anode) 810.

Figure 14B:
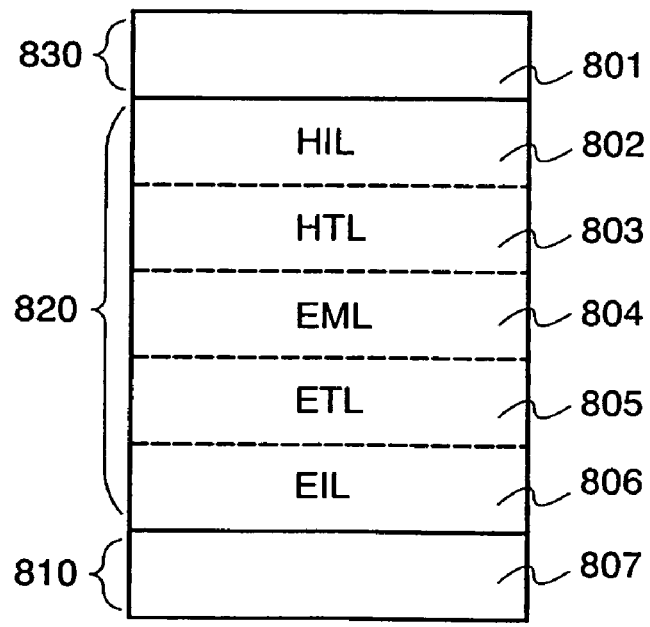

When the first electrode 810 is a cathode 807 and the second electrode 830 is an anode 801 as shown in FIG. 14B, the electroluminescent layer 820 is preferably formed by sequentially laminating an EIL (electron injection layer) 806, an ETL (electron transport layer) 805, an EML (light emitting layer) 804, an HTL (hole transport layer) 803, an HIL (hole injection layer) 802, and the second electrode (anode) 830 over the first electrode (cathode) 810.

The light emitting layer may perform color display by providing each pixel with light emitting layers having different emission wavelength bands. Typically, light emitting layers corresponding to each color of R (red), G (green), and B (blue) are formed. In this case, color purity can be increased and a pixel portion can be prevented from having a mirror surface (glare) by providing a light emitting side of the pixel with a filter which transmits light of the emission wavelength band. Providing the light emitting side of the pixel with the filter can omit a circularly polarizing plate or the like which is conventionally required and can eliminate the loss of light emitted from the light emitting layer. Further, change in hue, which occurs when the pixel portion (display screen) is obliquely seen, can be reduced.

As the light emitting layer, materials emitting light of red (R), green (G), and blue (B) are separately and selectively formed by an evaporation method using an evaporation mask. The materials emitting light of red (R), green (G), and blue (B) (a low molecular weight or high molecular weight material or the like) can also be formed by a droplet discharge method as is the case with a color filter. The droplet discharge method is preferable since coloring of RGB can be separately performed without using a mask.

In addition, the light emitting layer can be formed to emit monochrome or white light. In the case of using a white light emitting material, color display can be performed by providing a light emitting side of a pixel with a filter (colored layer) which transmits light having a specific wavelength.

In addition, a color filter (colored layer) may be formed over a sealing substrate. The color filter can be formed by an evaporation method or a droplet discharge method. When the color filter is used, high-definition display can also be performed. This is because the color filter can adjust a broad peak to sharp one in each emission spectrum of RGB.

The case of forming materials emitting each light of RGB is described hereinabove; however, full color display can also be performed by forming a material emitting light of single color and combining the material with a color filter or a color conversion layer. For example, the color filter or the color conversion layer may be formed over a second substrate (sealing substrate) and then attached to the substrate provided with the light emitting element. The color filter can be formed by an evaporation method or a droplet discharge method. When the color filter is used, the color filter can adjust a broad peak to sharp one in each emission spectrum of RGB. Therefore, high-definition display can be performed.

Further, a triplet excitation material including a metal complex or the like as well as a singlet excitation light emitting material may be used for the light emitting layer. For example, among pixels emitting red, green, and blue light, the pixel emitting red light whose luminance is reduced by half in a relatively short time is made of a triplet excitation light emitting material and the pixels emitting the other light are made of a singlet excitation light emitting material. A triplet excitation light emitting material has a characteristic in that the material has a good luminous efficiency and consumes less power to obtain the same luminance. When a triplet excitation material is used for a red pixel, only a small amount of current needs to be applied to the light emitting element. Therefore, reliability can be improved. The pixels emitting red and green light may be made of a triplet excitation light emitting material and the pixel emitting blue light may be made of a singlet excitation light emitting material to achieve lower power consumption. Lower power consumption can be achieved by forming the light emitting element which emits green light that has high visibility with a triplet excitation light emitting material.

The above-described materials for forming the light emitting layer are just examples. The light emitting element can be formed by appropriately laminating functional layers such as a hole injection transport layer, a hole transport layer, an electron injection transport layer, an electron transport layer, a light emitting layer, an electron blocking layer, and a hole blocking layer. Further, a mixed layer or a mixed junction of these layers may be formed. The layer structure of the light emitting layer can be varied. Instead of providing a specific electron injection region or light emitting region, modification such as providing an electrode for the purpose or providing a dispersed light emitting material is acceptable as long as it does not deviate from the scope of the invention.

The above-described light emitting element emits light by being biased in a forward direction. A pixel of a display device formed with the light emitting element can be driven by a simple matrix mode or an active matrix mode. In either mode, each pixel is made to emit light by applying a forward bias thereto in specific timing, and the pixel is in a non-light-emitting state for a certain period. Reliability of the light emitting element can be improved by applying a backward bias at this non-light-emitting time. In the light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating driving. Thus, reliability of the light emitting device can be improved. Either digital drive or analog drive can be applied to the light emitting element.

In the above structure, a material having a low work function can be used for the cathode; for example, Ca, Al, CaF, MgAg, AlLi, or the like is preferable. The electroluminescent layer may be any of a single-layer type, a laminated type, and a mixed type having no interface between layers. The electroluminescent layer may be formed of a singlet material, a triplet material, a combination thereof, or a charge injection transport material and a light emitting material containing an organic compound or an inorganic compound. Alternatively, the electroluminescent layer may include one or plural kinds of layers of a low molecular weight organic compound, an intermediate molecular weight organic compound (including oligomer, dendrimer, or the like), and a high molecular weight organic compound. The electroluminescent layer may be combined with an electron injection transport or hole injection transport inorganic compound. The first electrode is formed using a transparent conductive film which transmits light; for example, a transparent conductive film in which indium oxide is mixed with zinc oxide (ZnO) of 2 wt % to 20 wt % as well as ITO or ITSO is used.

According to the invention, a highly reliable display device can be manufactured. Therefore, a high-definition and high-quality display device can be manufactured at low cost and with high yield.

This embodiment mode can be appropriately combined with any of Embodiment Modes 1 to 4.

Embodiment Mode 6

In this embodiment mode, a method for manufacturing a thin film integrated circuit, to which the invention is applied, is explained.

First, a peeling layer 201 is formed over a substrate 200 as shown in FIG. 8A. A glass substrate of, for example, barium-borosilicate glass, alumino-borosilicate glass, or the like a quartz substrate, a ceramic substrate, or the like can be used as the substrate 200. Further, a metal substrate including a stainless steel substrate or a semiconductor substrate provided with an insulating film on its surface may also be used. Although a substrate made of a synthetic resin having flexibility, such as plastics, generally tends to have lower heat-resistance than the above-described substrate, it can be used as the substrate 200 as long as it can withstand process temperature in the manufacturing step. The surface of the substrate 200 may be planarized by polishing such as a CMP method. Note that a quartz substrate is used as the substrate 200 in this embodiment mode.

A metal-containing film can be used as the peeling layer 201. Specifically, the peeling layer 201 can be formed with a film containing any one of tungsten (W), molybdenum (Mo), niobium (Nb), or titanium (Ti). Further, oxide of the metal film may be formed on the metal film. Specifically, a film containing $WO_x$ can be formed on W; a film containing $Mo_x$, on Mo; a film containing $Nb_x$, on Nb; a film containing $TiO_x$, on Ti; or the like (x=2, 3). The peeling layer can be formed by a CVD method as well as a sputtering method. The peeling layer may be formed to have a thickness of 30 nm to 1 μm, preferably, 30 nm to 50 nm. In this embodiment mode, a metal film containing W is used as the peeling layer 201.

Next, an insulating film is selectively formed over the peeling layer 201 in a region to be provided with a thin film integrated circuit as shown in FIG. 8B. The insulating film can be formed to have a single-layer structure or a laminated structure. In this embodiment mode, it is formed to have a laminated structure of a first insulating film 202 and a second insulating film 203. For example, a silicon oxide film and a silicon oxynitride film are used as the first insulating film and the second insulating film, respectively. Alternatively, the insulating film may have a laminated structure of three layers: a silicon oxide film as a first insulating film, a silicon nitride oxide film as a second insulating film, and a silicon oxynitride film as a third insulating film. In the case where the peeling is performed in the following step using a physical means, a silicon oxide film is preferably used as the first insulating film 202 which is in direct contact with the peeling layer 201.

Subsequently, thin film transistors are formed over the insulating film 203 as shown in FIG. 8C. The thin film transistors include semiconductor films 211 and 212 which are patterned into desired shapes, an insulating film serving as a gate insulating film 213, and gate electrodes 214 and 215.

The semiconductor films 211 and 212 may have any condition of amorphous, semi-amorphous in which an amorphous state and a crystalline state are mixed, microcrystalline in which a crystal grain of 0.5 nm to 20 nm can be observed within an amorphous semiconductor, and crystalline.

Further, damage or peeling of the thin film transistor due to bending stress can be prevented by making the ratio of an area of the patterned semiconductor film in the thin film integrated circuit 1% to 30%.

The gate insulating film 213 is formed to cover the semiconductor films 211 and 212. The gate insulating film 213 can be a single layer of silicon oxide, silicon nitride, silicon nitride oxide, or the like or can be formed by laminating a plurality of films thereof. A plasma CVD method, a sputtering method, or the like can be used to form the gate insulating film 213. Here, the gate insulating film 213 is formed from an insulating film containing silicon to have a thickness of 30 nm to 200 nm by a sputtering method.

The gate electrodes 214 and 215 can be formed by forming a first conductive layer over the gate insulating film 213, forming a second conductive layer thereover, and patterning the first conductive layer and the second conductive layer. In this embodiment mode, tantalum nitride (TaN) is used for the first conductive layer and tungsten (W) is used for the second conductive layer. The TaN film and the W film may be simultaneously formed by a sputtering method. The TaN film may be formed using a target of tantalum in a nitrogen atmosphere. The W film may be formed using a target of tungsten.

In this embodiment mode, the first conductive layer is made from TaN and the second conductive layer is made from W. However, without limitation thereto, the first conductive layer and the second conductive layer may each be formed using an element selected from Ta, W, Ti, Mo, Al, Cu, Cr, and Nd, or an alloy material or a compound material containing the element as its main component. Alternatively, a semiconductor film as typified by a polycrystalline silicon film, doped with impurity elements such as phosphorus, may be used. An AgPdCu alloy may also be used. Combinations thereof may also be appropriately selected. The first conductive layer may be formed to have a thickness in the range of 20 nm to 100 nm. The second conductive layer may be formed to have a thickness in the range of 100 nm to 400 nm. In this embodiment mode, each of the gate electrodes is formed to have a laminated structure of two layers. Alternatively, each of them may have a single-layer structure or a laminated structure of three or more layers.

Subsequently, impurities imparting n-type or p-type conductivity are selectively added to the semiconductor films 211 and 212, using as a mask the gate electrode or a resist which is formed and patterned. Each of the semiconductor films 211 and 212 has a channel formation region and an impurity region (including a GOLD region or an LDD region in addition to a source region and a drain region), and can be distinguished from an n-channel TFT 204 and a p-channel TFT 205 depending on the conductivity of the added impurity elements.

In FIG. 8C, the n-channel TFT 204 has a sidewall on the side of the gate electrode 214, and a source region, a drain region, and an LDD region, to which impurities imparting n-type conductivity are selectively added, are formed in the semiconductor film 211. In the semiconductor film 212 of the p-channel TFT 205, a source region and a drain region, to which impurities imparting p-type conductivity are selectively added, are formed. Here, shown is a structure in which sidewalls are formed on the sides of the gate electrodes 214 and 215 and the LDD region is selectively formed in the n-channel TFT 204; however, the invention is not limited to this structure. The LDD region may also be formed in the p-channel TFT 205, or the sidewall may not be formed in the p-channel TFT 205.

Alternatively, a CMOS structure, in which the n-channel TFT 204 is complementarily combined with the p-channel TFT 205, may be formed. Note that a threshold value of the TFT may be controlled by doping the channel region of the semiconductor film located below the gate electrode with impurities imparting one conductivity in advance. For example, in the n-channel TFT 204, the semiconductor film 211 may be doped with impurities imparting p-type conductivity such as boron.

Subsequently, an interlayer insulating film 206 is formed as shown in FIG. 8D. In this embodiment mode, in order to apply the invention, a composition including an insulating material in which a resin containing a siloxane polymer is dissolved in a solvent is used as a material for forming the interlayer insulating film 206, and applied using an application apparatus.

Thereafter, an insulating film can be obtained by heating the composition together with the substrate to promote volatilization (evaporation) of the solvent and cross-linking reaction of the low molecular weight component. Note that the thickness of the insulating film is controlled by the number of spin rotation, rotational time, and concentration and viscosity of the composition including an insulating material, which is an application material liquid. Then, heat treatment is performed after applying the resin to form the insulating film. This heat treatment is performed in an atmosphere containing an inert gas as its main component and having an oxygen concentration of 5% or less and a water concentration of 1% or less. Preferably, an oxygen concentration is 1% or less (more preferably, 0.1% or less) and a water concentration is 0.1% or less. By controlling the concentration of oxygen and water in the heat treatment atmosphere as in the present invention, it becomes possible to prevent decrease in volume of the insulating film or lessening of a stress relaxation effect the organic group has due to reaction of oxygen and water in the heat treatment atmosphere with the organic group included in the insulating film. Accordingly, a favorable insulating film in which crack generation is suppressed can be formed. The baking may be performed in a chamber under atmospheric pressure or reduced pressure.

With the use of the above material, crack generation can be suppressed even if the thickness is thick; accordingly, an interlayer insulating film with sufficient insulation and planarity can be obtained. Further, the above material is highly resistant to heat; thus, an interlayer insulating film which can withstand the reflow process in a multilayer wiring can be obtained. Further, an interlayer insulating film with less dehydration can be formed due to low hygroscopicity of the material.

In addition, a first passivation film may be formed before forming the interlayer insulating film 206. An insulating film containing silicon is formed as the passivation film to have a thickness of 100 nm to 200 nm. A plasma CVD method or a sputtering method may be used to form the passivation film. Alternatively, a silicon oxynitride hydride film formed from $SiH_4$, $N_2O$, and $H_2$ may be used as the passivation film. Naturally, the passivation film can be formed to have a single-layer structure or a laminated structure.

Further, a second passivation film of a silicon nitride oxide film or the like may be formed after forming the interlayer insulating film 206. The second passivation film may be formed to have a thickness of approximately 10 nm to 200 nm, which can suppress the entry and exit of moisture into and from the interlayer insulating film 206. Alternatively, a silicon nitride film, an aluminum nitride film, an aluminum oxynitride film, a diamond-like carbon (DLC) film, or a carbon nitride (CN) film can be used as the second passivation film.

Next, the interlayer insulating film 206 is etched to form contact holes reaching the source regions and drain regions. Subsequently, wirings 207a to 207c, each of which is electrically connected to each source region and the drain region, are formed. The wirings 207a to 207c may each have a single-layer structure or a laminated structure of an element selected from Al, Ni, C, W, Mo, Ti, Pt, Cu, Ta, Au, and Mn, or an alloy containing a plurality of the elements. Here, the wirings 207a to 207c are preferably formed with a metal film containing Al. In this embodiment mode, a laminated film of a Ti film and an alloy film containing Al and Ti is patterned to form the wirings 207a to 207c. Naturally, the wirings may have a single-layer structure or a laminated structure of three or more layers without being limited to the two-layer structure. Further, the material of the wirings is not limited to a laminated film of Al and Ti. For example, a laminated film, in which an Al film or a Cu film is formed over a TaN film and a Ti film is further formed thereover, may be patterned to form the wirings 207a to 207c.

Then, an insulating film 208 is formed to cover the wirings 207a to 207c. An insulating film containing oxygen or nitrogen such as a silicon oxide ($SiO_x$) film, a silicon nitride ($SiN_x$) film, a silicon oxynitride ($SiO_xN_y$) (x>y>0) film, or a silicon nitride oxide ($SiN_xO_y$) (x>y>0) film can be used as the insulating film 208. Typically, a silicon nitride oxide ($SiN_xO_y$) film is preferably used. Alternatively, a resin film may be used.

Subsequently, a protective film 209 is formed over the insulating film 208 as shown in FIG. 9A. In this embodiment mode, in order to apply the invention, a composition including an insulating material in which a resin containing a siloxane polymer is dissolved in a solvent is applied to form the protective film 209.

An insulating film serving as the protective film 209 can be formed by heating the composition together with the substrate to promote volatilization (evaporation) of the solvent and cross-linking reaction of the low molecular weight component. Note that the thickness of the insulating film is controlled by the number of spin rotation, rotational time, and concentration and viscosity of the composition including an insulating material, which is an application material liquid. Then, heat treatment is performed after applying the resin to form the insulating film. This heat treatment is performed in an atmosphere containing an inert gas as its main component and having an oxygen concentration of 5% or less and a water concentration of 1% or less. Preferably, an oxygen concentration is 1% or less (more preferably, 0.1% or less) and a water concentration is 0.1% or less. By controlling the concentration of oxygen and water in the heat treatment atmosphere as in the present invention, it becomes possible to prevent decrease in volume of the insulating film or lessening of a stress relaxation effect the organic group has due to reaction of oxygen and water in the heat treatment atmosphere with the organic group included in the insulating film. Accordingly, a favorable insulating film in which crack generation is suppressed can be formed. The baking may be performed in a chamber under atmospheric pressure or reduced pressure.

A TFT layer 240 when peeled from the substrate 200 can be prevented from warping by providing the protective film 209. In this embodiment mode, the TFT layer 240 refers to the first insulating film 202, the second insulating film 203, the insulating film 213 (gate insulating film), the interlayer insulating film 206, and the insulating film 208 whose side faces are exposed in the opening.

Thereafter, the peeling layer 201 is completely removed. In this embodiment mode, the peeling layer is removed by chemical reaction thereof with an etchant. The peeling layer is removed by introducing a gas or a liquid containing halogen fluoride as the etchant. Here, the peeling layer is removed using an apparatus equipped with a pressure reducing means, a pressurizing means, and a temperature control means under the following conditions: etchant, $ClF_3$ (chlorine trifluoride); temperature, room temperature to 150° C.; and flow rate, 50 sccm; and pressure, 9 Torr. However, the conditions are not limited thereto. The apparatus has a bell jar which enables treatment of a plurality of the substrates 200. $ClF_3$ gas is introduced through a gas inlet tube, and unnecessary gas is expelled through an exhaust pipe. Further, a heating means, for example, a heater may be provided on the side face of the apparatus.

Here, as shown in FIG. 9A, a gas or a liquid containing halogen fluoride is introduced into an opening. When a processing temperature is in the range of 100° C. to 300° C. using a heating means, the reaction rate can be increased. Consequently, the consumption of a $ClF_3$ gas can be reduced and processing time can be shortened.

An etchant, gas flow rate, temperature, and the like are determined so that each layer of the TFT layer 240 is not etched. Since the $ClF_3$ gas used in this embodiment mode has a characteristic of selectively etching W, it selectively removes W which is the peeling layer. Therefore, a layer formed from a metal film containing W is used as the peeling layer and an insulating film containing oxygen or nitrogen is used as the base film. Since difference in the reaction rate between the peeling layer and the base film is large, meaning that the selectivity is high, the peeling layer can be easily removed with the TFT layer 240 protected. In this embodiment mode, the TFT layer 240 is not etched by $ClF_3$ due to the insulating films which are provided above and below the TFT layer 240 and edge portions of the interlayer insulating film, the gate insulating film, the wiring, and the like which are exposed on the side face.

Note that $ClF_3$ can be generated through the process of $Cl_2(g) + 3F_2(g) \rightarrow 2ClF_3(g)$ by the reaction of chlorine with fluorine at a temperature of 200° C. or more. $ClF_3$ (boiling point: 11.75° C.) may be liquid in some cases depending on the temperature of the reaction field. In that case, wet etching can also be employed using a liquid containing halogen fluoride.

A gas of $ClF_3$ or the like mixed with nitrogen may be used as another gas containing halogen fluoride.

The etchant is not limited to $ClF_3$ or halogen fluoride as long as it etches the peeling layer and it does not etch the base film. For example, a plasma gas containing fluorine such as $CF_4$, $SF_6$, $NF_3$, or $F_2$ can be used. A strong alkaline solution such as tetramethylammonium hydroxide (TMAH) may be used as another etchant.

The combination of the peeling layer and the base film is not limited to the above-described material as long as the material that is selectively etched is used for the peeling layer and a material that is not etched is used for the base film in the case of chemically removing the peeling layer with a gas containing halogen fluoride such as $ClF_3$.

Subsequently, the substrate 200 is peeled after removing the peeling layer 201. In the case of completely removing the peeling layer 201, the substrate 200 can be separated from the TFT layer 240 as shown in FIG. 9B without using a physical means.

On the other hand, a method for separating the TFT layer 240 from the substrate 200 without completely removing the peeling layer is explained with reference to FIGS. 10A to 11C.

In FIG. 10A, after similar formation up to the step shown in FIG. 9A, an etchant is introduced into an opening and a part of the peeling layer 221 is left without completely removing the peeling layer 201. How much of the peeling layer 201 is left can be controlled by adjusting the etchant flow rate and reaction time.

Thereafter, an auxiliary substrate 222 is provided over the protective film 209 as shown in FIG. 10B. As the auxiliary substrate 222, a quartz substrate or a flexible substrate is used. When a flexible substrate is used, it can be attached to the protective film 209 with a flexible film having an adhesive on one surface. In this case, an adhesive such as a thermosetting resin, an ultraviolet curing resin, an epoxy or acrylic resin, or a resin additive, or tape can be used as the adhesive for attaching the auxiliary substrate 222 to the protective film 209.

Then, the TFT layer 240 is physically peeled from the substrate 200 using the auxiliary substrate 221 as shown in FIG. 10C. Through the above steps, the TFT layer 240 can be peeled from the substrate 200. Since the TFT layer 240 can be peeled from the substrate, by using this method, without completely removing the peeling layer, the processing time of the peeling step can be shortened. The peeled TFT layer 240 can be obtained in a regularly arranged state, which is the same as before the peeling. In other words, since the peeling is performed without completely removing the peeling layer 201, the TFT layer 240 attached to the auxiliary substrate 221 can be obtained in an arranged state, which is the same as before the peeling. Therefore, the processing time can be shortened also in the following step.

Since the TFT layer 240 peeled from the substrate 200 is provided with the protective film 209 for reinforcement, it may be directly mounted on an article or may be mounted together with a transfer substrate to which the TFT layer 240 is separately transferred. The case of separately transferring the TFT layer 240 to a transfer substrate is explained with reference to FIGS. 11A to 11C.

Figure 11A:
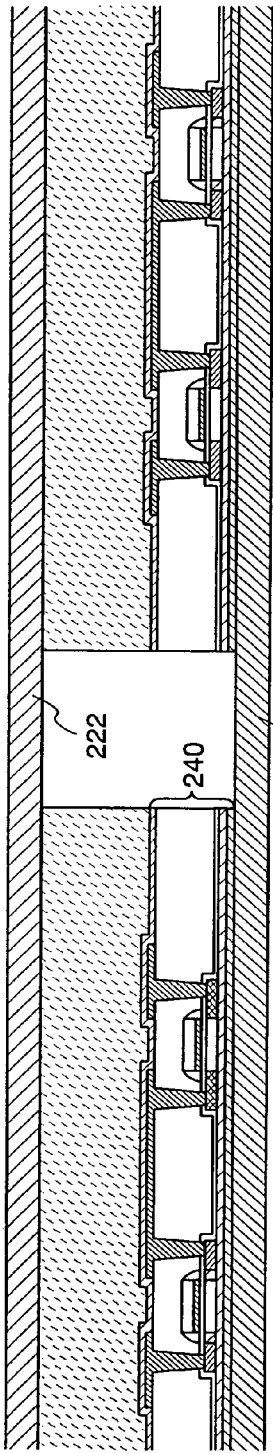
FIGS. 11A to 11C show a method for manufacturing a semiconductor device of the invention (Embodiment Mode 6).
Figure 11B:
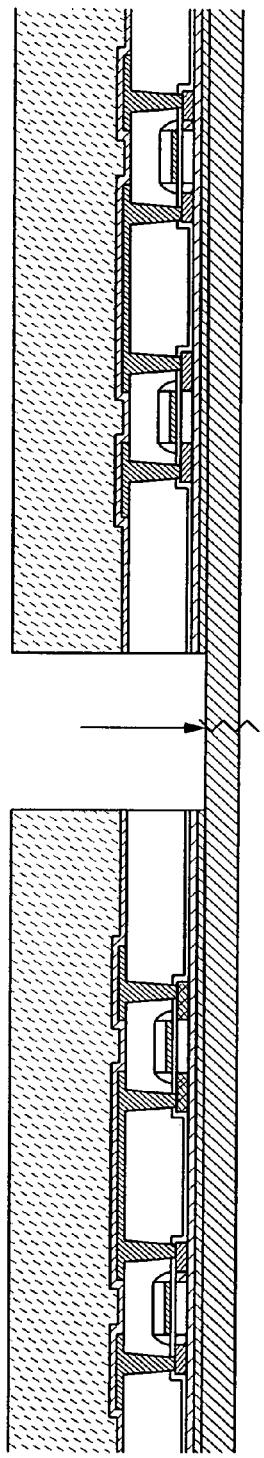

As shown in FIG. 11A, the peeled TFT layer 240 is attached to a transfer substrate 223. As the transfer substrate 223, a flexible substrate is preferably used. A substrate made of a synthetic resin such as plastic typified by polyethyleneterephthalate (PET), polyethylenenaphthalate (PEN), or polyethersulfone (PES) or acrylic can be used as the flexible substrate. When the TFT layer 240 has a problem with strength, the transfer substrate 223 provided with an organic resin such as an epoxy resin is preferably used.

Figure 11C:
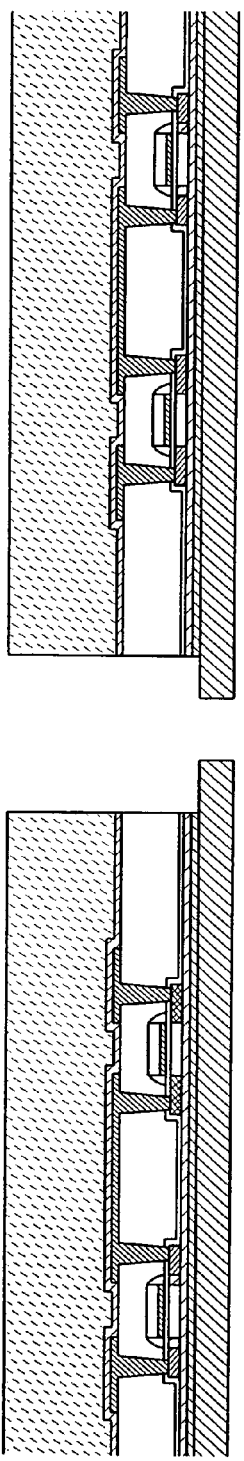

Thereafter, the auxiliary substrate 222 is peeled and the transfer substrate 223 is selectively cut by a dicing, scribing, or laser cutting method (see FIG. 11B), thereby separating the thin film integrated circuits from one another (see FIG. 11C). In this embodiment mode, the thin film integrated circuits are cut using a $CO_2$ laser which is absorbed by a glass substrate. The TFT layer 240 may be provided with an organic resin such as an epoxy resin around the side face or the like for reinforcement. Consequently, the TFT layer 240 can be protected from the external, and the mechanical strength can be more improved.

The peeled substrate 200 can be reused. Accordingly, cost reduction can be achieved in manufacturing a thin film integrated circuit using a substrate. For example, a quartz substrate has advantages of good planarity, high heat-resistance, and the like; however, it has a problem of high cost. However, by reusing the substrate, cost reduction can be achieved even in the case of using a quartz substrate of which cost is higher than a glass substrate.

Embodiment Mode 7

In this embodiment mode, an example of applying the invention, when a substrate provided with a semiconductor element is attached to a transparent sealing substrate and either or both of the substrates are provided with a columnar or wall-shaped structure (spacer) for keeping the distance between the substrates constant, is explained.

A liquid crystal display panel corresponding to one aspect of the semiconductor device manufactured by the invention is shown in FIGS. 15A and 15B. FIG. 15A shows a top view of the panel in which a gap between the first substrate 1600 and the second substrate 1604 is sealed by the first sealing material 1605 and the second sealing material 1606. Further, FIG. 15B corresponds to the cross section taken along A-A' and B-B' of FIG. 15A.

In FIG. 15A, 1601 denotes a signal line (gate line) driver circuit, 1602 denotes a pixel portion, and 1603 denotes a scanning line driver circuit. Further, the pixel portion 1602 and the scanning line driver circuit 1603 are provided within a region sealed by the first sealing material 1605 and the second sealing material 1606.

A liquid crystal material 1619 is filled between the first substrate 1600 and the second substrate 1604. A gap material is contained in the first sealing material 1605 and the second sealing material 1606 in order to maintain a gap between the enclosed space.

Next, a cross sectional structure is explained with reference to FIG. 15B. Since the pixel portion 1602 and the scanning line driver circuit 1603 are formed over the first substrate 1600, an area of the display device can be decreased. Further, the pixel portion 1602 and the scanning line driver circuit 1603 contain a plurality of semiconductor element typified by thin film transistors. For instance, CMOS circuits in which an n-channel TFT 1612 and a p-channel TFT 1613 are combined are formed in the scanning line driver circuit 1603. Further, a color filter 1621 is provided over a surface of the second substrate 1604.

A plurality of pixels are formed in the pixel portions 1601, and a liquid crystal element 1615 is formed in each pixel. The liquid crystal element 1615 refers to a portion where the first electrode 1616 is overlapped with the second electrode 1618 with the liquid crystal material 1619 interposed therebetween. The first electrode 1616 is electrically connected to the pixel driving TFT 1611 through the wiring 1617. Although the first electrode 1616 is formed after forming the wiring 1617 in this Embodiment Mode, the wiring 1617 can be formed after forming the first electrode 1616. The second electrode 1618 for the liquid crystal element 1615 is formed at the second substrate 1604 side. Further, orientation films 1630 and 1631 are formed on the first electrode 1616 and the second electrode 1618, respectively.

Although not shown in the drawing, a polarization plate is fixed on one side surface or both side surfaces of the first substrate 1600 and the second substrate 1604 by an adhesive. Note that a circular polarization plate or an elliptical polarization plate equipped with a retardation film can be used as the polarization plate.

The reference numeral 1622 denotes a columnar or wall-shaped structure (spacer) for maintaining a gap (cell gap) between the first electrode 1616 and the second electrode 1618. The spacer 1622 is formed by etching an insulating film into a desired shape. Various signals and potentials sent to the signal line driver circuit 1601 or to the pixel portion 1602 are supplied from the flexible printed circuit (FPC) 1609 through the connection wiring 1623. Note that the FPC 1609 and the connection wiring 1623 are electrically connected with each other by anisotropic conductive film or anisotropic conductive resin 1627. The anisotropic conductive film or anisotropic conductive resin 1627 can be replaced with a conductive paste such as solder, etc. A Method for providing the spacer 1622 by using the invention is explained.

First, a composition including an insulating material in which a resin containing a siloxane polymer is dissolved in a solvent is applied over the substrate using an application apparatus as a material for forming a columnar or wall-shaped structure (spacer) 1622. The composition may be applied to either the substrate provided with a semiconductor element or an opposed sealing substrate. Alternatively, it may be applied to both of the substrates.

Thereafter, an insulating film is formed by heating the composition together with the substrate to promote volatilization (evaporation) of the solvent and cross-linking reaction of the low molecular weight component. The thickness of the insulating film is controlled by the number of spin rotation, rotational time, and concentration and viscosity of the composition including an insulating material, which is an application material liquid. Then, heat treatment is performed after applying the resin to form the insulating film. This heat treatment is performed in an atmosphere containing an inert gas as its main component and having an oxygen concentration of 5% or less and a water concentration of 1% or less. Preferably, an oxygen concentration is 1% or less (more preferably, 0.1% or less) and a water concentration is 0.1% or less. By controlling the concentration of oxygen and water in the heat treatment atmosphere as in the present invention, it becomes possible to prevent decrease in volume of the insulating film or lessening of a stress relaxation effect the organic group has due to reaction of oxygen and water in the heat treatment atmosphere with the organic group included in the insulating film. Accordingly, a favorable insulating film in which crack generation is suppressed can be formed. The heat treatment is performed at 350° C. for one hour. The baking may be performed in a chamber under atmospheric pressure or reduced pressure.

Lastly, the insulating film is patterned into a desired shape, thereby forming the columnar or wall-shaped structure (spacer) 1622.

As described in this embodiment mode, a columnar or wall-shaped structure (spacer) 1622 in which crack generation is suppressed can be obtained by applying the invention when a composition including an insulating material in which a resin containing a siloxane polymer is dissolved in a solvent is applied over the substrate and then heat-treated.

Embodiment Mode 8

Examples of electronic devices using the semiconductor device manufactured according to the present invention can be given as follows: a TV set, a camera (a video camera, a digital camera, or the like), a goggle type display, a navigation system, an audio reproducing device (car audio, an audio component, or the like), a computer, a game machine, a portable information terminal (a mobile computer, a cellular phone, a portable game machine, an electronic book, or the like), an image reproducing device including a recording medium (specifically, a device capable of processing data in a recording medium such as a digital versatile disc (DVD) or Blue-ray Disc and having a display that can display the image of the data), and other electronics each having a display portion. Practical examples of these electronic devices are shown in FIGS. 12A to 13G.

Figure 12A:
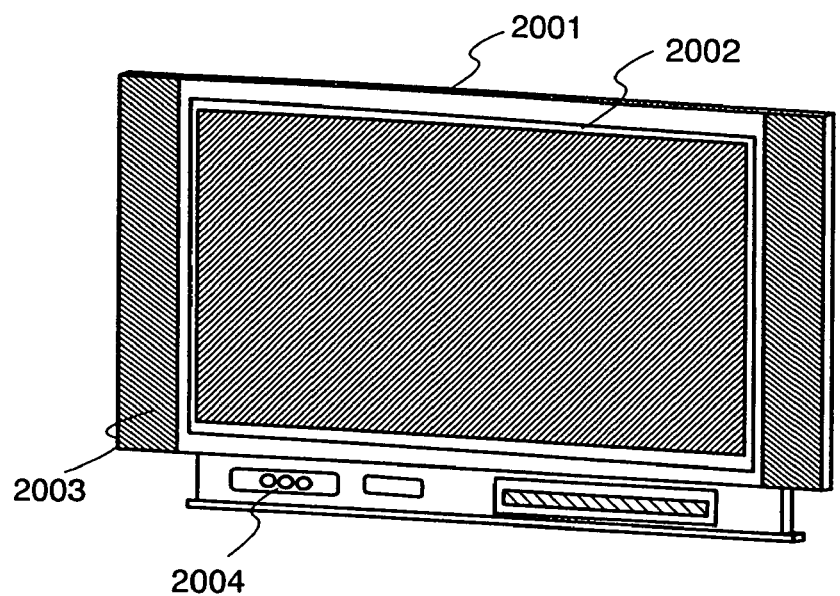
FIGS. 12A and 12B show electronic devices using a semiconductor device manufactured according to the invention (Embodiment Mode 8).

FIG. 12A shows a TV set, which includes a chassis 2001, a display portion 2002, a loudspeaker portion 2003, a video input terminal 2004, or the like. The TV set can be manufactured by using the semiconductor device manufactured according to the invention in the display portion 2002 or the like.

Figure 12B:
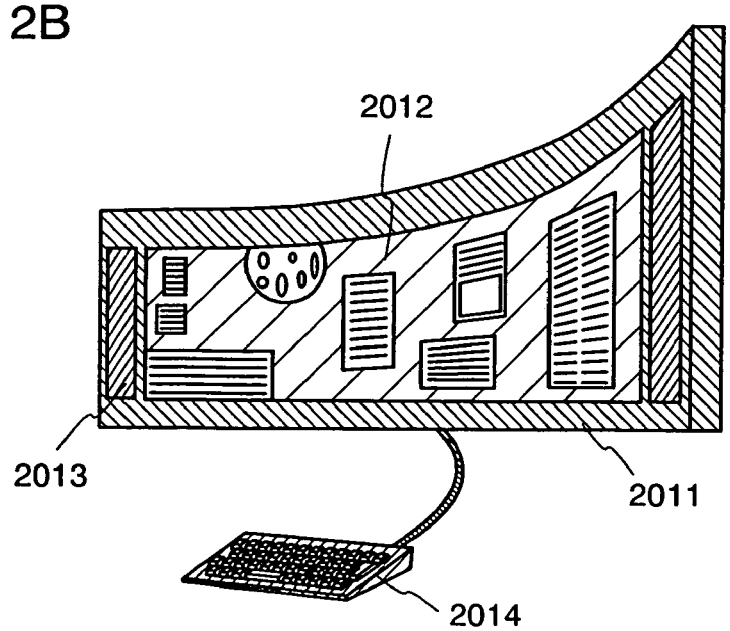

FIG. 12B shows a TV set having a large-size (20-inch or larger) display portion, which includes a chassis 2011, a display portion 2012, a loudspeaker portion 2013, a keyboard 2014 that is an operation portion, or the like. The invention is applied to manufacturing of the display portion 2012. Since a material which can be curved is used for the display portion 2012, the TV set has a curved display portion. As described above, the shape of the display portion can be freely designed; therefore, a TV set having a desired shape can be manufactured.

According to the invention, an insulating film having good planarity and good reliability since crack generation is suppressed can be formed. Consequently, a high-performance and highly-reliable TV set can be manufactured with high yield.

Naturally, the present invention is not limited to the TV set and can also be applied to various uses as a large-area display medium such as an information display board in a train station, an airport, or the like, or an advertisement display board in the street as well as a monitor of a personal computer.

Figure 13A:
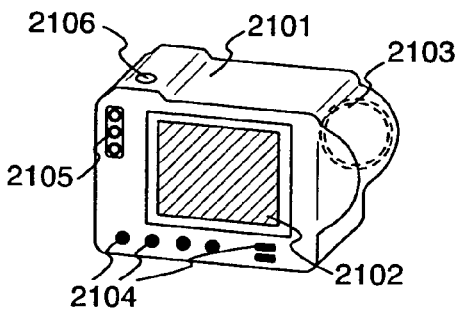
FIGS. 13A to 13G show electronic devices using a semiconductor device manufactured according to the invention (Embodiment Mode 8).

FIG. 13A shows a digital camera, which includes a main body 2101, a display portion 2102, an image receiving portion 2103, an operation key 2104, an external connection port 2105, a shutter 2106, or the like. The digital camera can be manufactured by using the semiconductor device manufactured according to the invention in the display portion 2102, circuits in other than the display portion 2102, or the like. According to the invention, an insulating film having good planarity and good reliability since crack generation is suppressed can be formed. Consequently, a high-performance and highly-reliable digital camera can be manufactured with high yield.

Figure 13B:
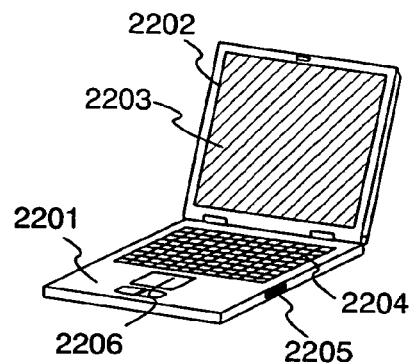

FIG. 13B shows a computer, which includes a main body 2201, a chassis 2202, a display portion 2203, a keyboard 2204, an external connection port 2205, a pointing mouse 2206, or the like. The computer can be manufactured by using the semiconductor device manufactured according to the invention in the display portion 2203, circuits in other than the display portion 2203, or the like. According to the invention, an insulating film having good planarity and good reliability since crack generation is suppressed can be formed. Consequently, a high-performance and highly-reliable computer can be manufactured with high yield.

Figure 13C:
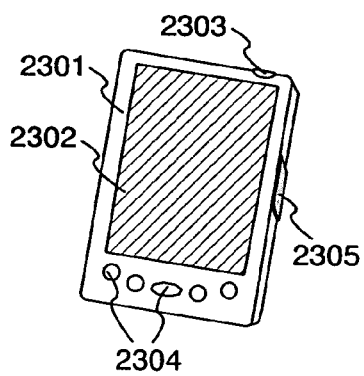

FIG. 13C shows a mobile computer, which includes a main body 2301, a display portion 2302, a switch 2303, an operating key 2304, an infrared port 2305, or the like. The mobile computer can be manufactured by using the semiconductor device manufactured according to the invention in the display portion 2302, circuits in other than the display portion 2302, or the like. According to the invention, an insulating film having good planarity and good reliability since crack generation is suppressed can be formed. Consequently, a high-performance and highly-reliable mobile computer can be manufactured with high yield.

Figure 13D:
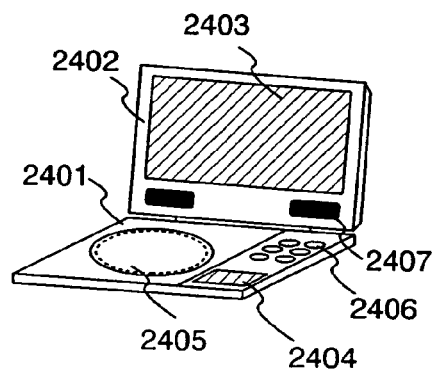

FIG. 13D shows a portable image reproducing device having a recording medium (a DVD reproducing device or the like), which includes a main body 2401, a chassis 2402, a display portion A 2403, a display portion B 2404, a recording medium (DVD or the like) reading portion 2405, an operation key 2406, a loudspeaker portion 2407, or the like. The display portion A 2403 mainly displays image information, and the display portion B 2404 mainly displays character information. The image reproducing device can be manufactured by using the semiconductor device manufactured according to the invention in the display portion A 2403, the display portion B 2404, circuits in other than the display portions 2403 and 2404, or the like. Note that the image reproducing device having a recording medium includes a game machine and the like. According to the invention, an insulating film having good planarity and good reliability since crack generation is suppressed can be formed. Consequently, a high-performance and highly-reliable mobile image reproducing device can be manufactured with high yield.

Figure 13E:
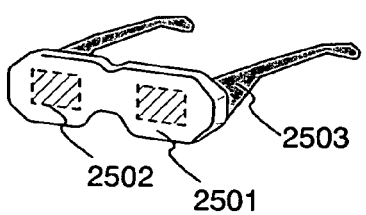

FIG. 13E shows a goggle type display, which includes a main body 2501, a display portion 2502, an arm portion 2503, or the like. The goggle type display can be manufactured by using the semiconductor device manufactured according to the invention in the display portion 2502, circuits in other than the display portion 2502, or the like. According to the invention, an insulating film having good planarity and good reliability since crack generation is suppressed can be formed. Consequently, a high-performance and highly-reliable goggle type display can be manufactured with high yield.

Figure 13F:
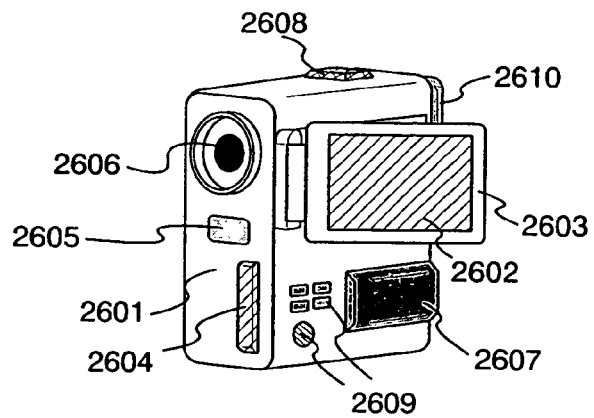

FIG. 13F shows a video camera, which includes a main body 2601, a display portion 2602, a chassis 2603, an external connection port 2604, a remote control receiving portion 2605, an image receiving portion 2606, a battery 2607, an audio input portion 2608, an operation key 2609, an eye piece portion 2610, or the like. The video camera can be manufactured by using the semiconductor device manufactured according to the invention in the display portion 2602, circuits in other than the display portion 2602, or the like. According to the invention, an insulating film having good planarity and good reliability since crack generation is suppressed can be formed. Consequently, a high-performance and highly-reliable video camera can be manufactured with high yield.

Figure 13G:
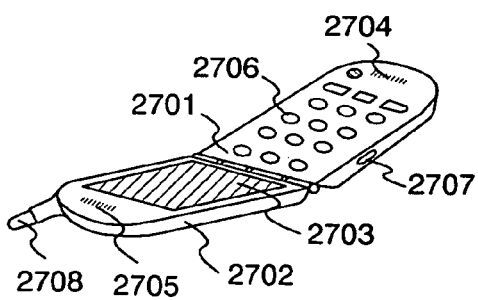

FIG. 13G shows a cellular phone, which includes a main body 2701, a chassis 2702, a display portion 2703, an audio input portion 2704, an audio output portion 2705, an operation key 2706, an external connection port 2707, an antenna 2708, or the like. The cellular phone can be manufactured by using the semiconductor device manufactured according to the invention in the display portion 2703, circuits in other than the display portion 2703, or the like. According to the invention, an insulating film having good planarity and good reliability since crack generation is suppressed can be formed. Consequently, a high-performance and highly-reliable cellular phone can be manufactured with high yield.

Note that the semiconductor device can also be used for a front or rear projector as well as the above-described electronic devices.

As described above, the applicable range of the present invention is so wide that the invention can be applied to electronic devices in various fields.

This application is based on Japanese Patent Application serial No. 2004-284952 filed in Japan Patent Office on Sep. 29, 2004, the entire contents of which are hereby incorporated by reference.

What is claimed is:

1. A method for manufacturing a semiconductor device comprising:
forming a base film over an insulating substrate;
forming a thin film transistor over the base film, wherein the thin film transistor includes a semiconductor layer, a gate insulating film and a gate electrode;
forming a first interlayer insulating film over the gate insulating film and the gate electrode;
forming a first contact hole in the first interlayer insulating film;
forming a wiring over the first interlayer insulating film, wherein the wiring is electrically connected to the semiconductor layer through the first contact hole;
forming a resin containing siloxane polymer over the first interlayer insulating film and the wiring;
heating the resin in an atmosphere containing an inert gas to form a second interlayer insulating film, wherein the atmosphere has an oxygen concentration of 5% or less and a water concentration of 1% or less;
forming a second contact hole in the second interlayer insulating film; and
forming an electrode over the second interlayer insulating film, wherein the electrode is electrically connected to the wiring through the second contact hole.

2. A method for manufacturing a semiconductor device according to claim 1, wherein a difference in thickness from the insulating substrate to a top surface of the wiring or the first interlayer insulating film between the thickest part and the thinnest part is 300 nm or more.

3. A method for manufacturing a semiconductor device according to claim 1, wherein the thickest part of the second interlayer insulating film has a thickness of 1.0 μm or more.

4. A method for manufacturing a semiconductor device according to claim 1, wherein the resin containing siloxane polymer includes a methyl group and a phenyl group.

5. A method for manufacturing a semiconductor device according to claim 1, wherein the inert gas contains nitrogen.

6. A method for manufacturing a semiconductor device according to claim 1, wherein the semiconductor device is an EL display device.

7. A method for manufacturing a semiconductor device according to claim 1, wherein the semiconductor device is a digital camera, a computer, an image reproducing device, a goggle type display, a video camera, a TV set, and a cellular phone.

8. A method for manufacturing a semiconductor device comprising:
forming a base film over an insulating substrate;
forming an amorphous semiconductor film over the base film;
crystallizing the amorphous semiconductor film;
forming a semiconductor layer by patterning the crystallized semiconductor film;
forming a gate insulating film over the semiconductor layer;
forming a gate electrode over the gate insulating film;
forming a first impurity region and a second impurity region by doping an impurity into the semiconductor layer;
forming a first interlayer insulating film over the gate insulating film and the gate electrode;
forming a first contact hole in the first interlayer insulating film;
forming a wiring over the first interlayer insulating film, wherein the wiring is electrically connected to the first impurity region through the first contact hole;
forming a resin containing siloxane polymer over the first interlayer insulating film and the wiring;
heating the resin in an atmosphere containing an inert gas to form a second interlayer insulating film, wherein the atmosphere has an oxygen concentration of 5% or less and a water concentration of 1% or less;
forming a second contact hole in the second interlayer insulating film; and
forming an electrode over the second interlayer insulating film, wherein the electrode is electrically connected to the wiring through the second contact hole.

9. A method for manufacturing a semiconductor device according to claim 8, wherein a difference in thickness from the insulating substrate to a top surface of the wiring or the first interlayer insulating film between the thickest part and the thinnest part is 300 nm or more.

10. A method for manufacturing a semiconductor device according to claim 8, wherein the thickest part of the second interlayer insulating film has a thickness of 1.0 μm or more.

11. A method for manufacturing a semiconductor device according to claim 8, wherein the resin containing siloxane polymer includes a methyl group and a phenyl group.

12. A method for manufacturing a semiconductor device according to claim 8, wherein the inert gas contains nitrogen.

13. A method for manufacturing a semiconductor device according to claim 8, wherein the semiconductor device is an EL display device.

14. A method for manufacturing a semiconductor device according to claim 8, wherein the semiconductor device is a digital camera, a computer, an image reproducing device, a goggle type display, a video camera, a TV set, and a cellular phone.

15. A method for manufacturing a semiconductor device comprising:
forming a base film over an insulating substrate;
forming a thin film transistor over the base film, wherein the thin film transistor includes a semiconductor layer, a gate insulating film and a gate electrode;
forming a first interlayer insulating film over the gate insulating film and the gate electrode;
forming a first contact hole in the first interlayer insulating film;
forming a wiring over the first interlayer insulating film, wherein the wiring is electrically connected to the semiconductor layer through the first contact hole;
forming a resin containing siloxane polymer over the first interlayer insulating film and the wiring;
first heating the resin in an atmosphere containing an inert gas to form a second interlayer insulating film, wherein the atmosphere has an oxygen concentration of 5% or less and a water concentration of 1% or less;
forming a second contact hole in the second interlayer insulating film;
forming an electrode over the second interlayer insulating film, wherein the electrode is electrically connected to the wiring through the second contact hole; and
second heating the resin in an atmosphere containing an inert gas, wherein the atmosphere has an oxygen concentration of 5% or less and a water concentration of 1% or less.

16. A method for manufacturing a semiconductor device according to claim 15, wherein a difference in thickness from the insulating substrate to a top surface of the wiring or the first interlayer insulating film between the thickest part and the thinnest part is 300 nm or more.

17. A method for manufacturing a semiconductor device according to claim 15, wherein the thickest part of the second interlayer insulating film has a thickness of 1.0 μm or more.

18. A method for manufacturing a semiconductor device according to claim 15, wherein the resin containing siloxane polymer includes a methyl group and a phenyl group.

19. A method for manufacturing a semiconductor device according to claim 15, wherein the inert gas contains nitrogen.

20. A method for manufacturing a semiconductor device according to claim 15, wherein the semiconductor device is an EL display device.

21. A method for manufacturing a semiconductor device according to claim 15, wherein the semiconductor device is a digital camera, a computer, an image reproducing device, a goggle type display, a video camera, a TV set, and a cellular phone.

22. A method for manufacturing a semiconductor device comprising:
    forming a base film over an insulating substrate;
    forming a thin film transistor over the base film, wherein the thin film transistor includes a semiconductor layer, a gate insulating film and a gate electrode;
    forming a first interlayer insulating film over the gate insulating film and the gate electrode;
    forming a first contact hole in the first interlayer insulating film;
    forming a wiring over the first interlayer insulating film, wherein the wiring is electrically connected to the semiconductor layer through the first contact hole;
    forming a resin containing siloxane polymer over the first interlayer insulating film and the wiring;
    first heating the resin in an atmosphere containing an inert gas to form a second interlayer insulating film, wherein the atmosphere has an oxygen concentration of 5% or less and a water concentration of 1% or less;
    forming a second contact hole in the second interlayer insulating film;
    forming a first electrode over the second interlayer insulating film, wherein the first electrode is electrically connected to the wiring through the second contact hole;
    second heating the resin in an atmosphere containing an inert gas, wherein the atmosphere has an oxygen concentration of 5% or less and a water concentration of 1% or less;
    forming an insulating film to cover a portion of the first electrode;
    third heating the resin in an atmosphere containing an inert gas, wherein the atmosphere has an oxygen concentration of 5% or less and a water concentration of 1% or less;
    forming an electroluminescent layer to cover a region of the first electrode, which is not covered with the insulating film; and
    forming a second electrode over the electroluminescent layer.

23. A method for manufacturing a semiconductor device according to claim 22, wherein a difference in thickness from the insulating substrate to a top surface of the wiring or the first interlayer insulating film between the thickest part and the thinnest part is 300 nm or more.

24. A method for manufacturing a semiconductor device according to claim 22, wherein the thickest part of the second interlayer insulating film has a thickness of 1.0 μm or more.

25. A method for manufacturing a semiconductor device according to claim 22, wherein the resin containing siloxane polymer includes a methyl group and a phenyl group.

26. A method for manufacturing a semiconductor device according to claim 22, wherein the inert gas contains nitrogen.

27. A method for manufacturing a semiconductor device according to claim 22, wherein the semiconductor device is an EL display device.

28. A method for manufacturing a semiconductor device according to claim 22, wherein the semiconductor device is a digital camera, a computer, an image reproducing device, a goggle type display, a video camera, a TV set, and a cellular phone.

29. A method for manufacturing a semiconductor device comprising:
    forming a base film over an insulating substrate;
    forming an amorphous semiconductor film over the base film;
    crystallizing the amorphous semiconductor film;
    forming a semiconductor layer by patterning the crystallized semiconductor film;
    forming a gate insulating film over the semiconductor layer;
    forming a gate electrode over the gate insulating film;
    forming a first impurity region and a second impurity region by doping an impurity into the semiconductor layer;
    forming an inorganic insulating material over the gate insulating film and the gate electrode;
    forming a resin containing siloxane polymer over the inorganic insulating material;
    heating the resin in an atmosphere containing an inert gas, wherein the atmosphere has an oxygen concentration of 5% or less and a water concentration of 1% or less;
    forming a contact hole in the inorganic insulating material and the resin; and
    forming a wiring over the inorganic insulating material and resin, wherein the wiring is electrically connected to the first impurity region through the contact hole.

30. A method for manufacturing a semiconductor device according to claim 29, wherein the resin containing siloxane polymer includes a methyl group and a phenyl group.

31. A method for manufacturing a semiconductor device according to claim 29, wherein the inert gas contains nitrogen.

32. A method for manufacturing a semiconductor device according to claim 29, wherein the semiconductor device is an EL display device.

33. A method for manufacturing a semiconductor device according to claim 29, wherein the semiconductor device is a digital camera, a computer, an image reproducing device, a goggle type display, a video camera, a TV set, and a cellular phone.

34. A method for manufacturing a semiconductor device comprising:
    forming a base film over an insulating substrate;
    forming an amorphous semiconductor film over the base film;
    crystallizing the amorphous semiconductor film;
    forming a semiconductor layer by patterning the crystallized semiconductor film;
    forming a gate insulating film over the semiconductor layer;
    forming a gate electrode over the gate insulating film;
    forming a first impurity region and a second impurity region by doping an impurity into the semiconductor layer;
    forming an inorganic insulating material over the gate insulating film and the gate electrode;

forming a resin containing siloxane polymer over the inorganic insulating material;

heating the resin in an atmosphere containing an inert gas, wherein the atmosphere has an oxygen concentration of 5% or less and a water concentration of 1% or less;

forming a contact hole in the inorganic insulating material and the resin;

forming a wiring over the inorganic insulating material and the resin, wherein the wiring is electrically connected to the first impurity region through the contact hole; and forming an electrode which overlaps a portion of the wiring.

35. A method for manufacturing a semiconductor device according to claim 34, wherein the resin containing siloxane polymer includes a methyl group and a phenyl group.

36. A method for manufacturing a semiconductor device according to claim 34, wherein the inert gas contains nitrogen.

37. A method for manufacturing a semiconductor device according to claim 34, wherein the semiconductor device is an EL display device.

38. A method for manufacturing a semiconductor device according to claim 34, wherein the semiconductor device is a digital camera, a computer, an image reproducing device, a goggle type display, a video camera, a TV set, and a cellular phone.

* * * * *